United States Patent
Huang et al.

(10) Patent No.: US 11,741,902 B2
(45) Date of Patent: Aug. 29, 2023

(54) SHIFT REGISTER AND DRIVING METHOD THEREOF, GATE DRIVER CIRCUIT AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yao Huang, Beijing (CN); Kaipeng Sun, Beijing (CN); Yuanyou Qiu, Beijing (CN); Yang Zhou, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 101 days.

(21) Appl. No.: 17/614,311

(22) PCT Filed: Dec. 31, 2020

(86) PCT No.: PCT/CN2020/142087
§ 371 (c)(1),
(2) Date: Nov. 24, 2021

(87) PCT Pub. No.: WO2021/136496
PCT Pub. Date: Jul. 8, 2021

(65) Prior Publication Data
US 2022/0230593 A1    Jul. 21, 2022

(30) Foreign Application Priority Data

Jan. 2, 2020  (CN) .......................... 202020004881.5

(51) Int. Cl.
*G11C 19/28* (2006.01)
*G09G 3/3266* (2016.01)

(52) U.S. Cl.
CPC .......... *G09G 3/3266* (2013.01); *G11C 19/28* (2013.01); *G09G 2310/0286* (2013.01); *G09G 2310/08* (2013.01)

(58) Field of Classification Search
CPC ......... G09G 3/3266; G09G 2310/0286; G09G 2310/08; G11C 19/28
See application file for complete search history.

(56) References Cited

U.S. PATENT DOCUMENTS

2003/0002615 A1  1/2003  Morosawa et al.
2008/0191994 A1  8/2008  Chiang et al.
(Continued)

FOREIGN PATENT DOCUMENTS

CN       1395256 A    2/2003
CN     101241765 A    8/2008
(Continued)

*Primary Examiner* — Adam J Snyder
(74) *Attorney, Agent, or Firm* — IP & T GROUP LLP

(57) ABSTRACT

A shift register includes: a first input sub-circuit configured to transmit a first clock signal to a first node in response to an input signal and a first voltage signal; a first output sub-circuit configured to transmit a second voltage signal to a first output signal terminal under control of a voltage of the first node; a second input sub-circuit configured to transmit the input signal to a second node in response to the first clock signal; and, a second output sub-circuit configured to transmit the first voltage signal to the first output signal terminal under control of a voltage of the second node. A voltage value of one of the first voltage signal and the second voltage signal is greater than that of a reference voltage, and a voltage value of another one is less than that of the reference voltage.

19 Claims, 16 Drawing Sheets

(56) References Cited

U.S. PATENT DOCUMENTS

| | | | |
|---|---|---|---|
| 2015/0371716 A1 | 12/2015 | Shao et al. | |
| 2017/0116926 A1* | 4/2017 | Bong | G09G 3/3266 |
| 2017/0287413 A1 | 10/2017 | Li et al. | |
| 2018/0301101 A1 | 10/2018 | Hu et al. | |
| 2019/0057978 A1* | 2/2019 | Kim | G09G 3/3266 |
| 2019/0130847 A1* | 5/2019 | Um | G09G 3/3266 |
| 2019/0295453 A1* | 9/2019 | Li | G09G 3/3266 |

FOREIGN PATENT DOCUMENTS

| | | | |
|---|---|---|---|
| CN | 101546607 A | 9/2009 | |
| CN | 101556833 A | 10/2009 | |
| CN | 104078017 A | 10/2014 | |
| CN | 105427825 A | 3/2016 | |
| CN | 106448540 A | 2/2017 | |
| CN | 106504721 A | 3/2017 | |
| CN | 107424649 A | 12/2017 | |
| CN | 107481658 A | 12/2017 | |
| CN | 108399884 A | 8/2018 | |
| CN | 210692046 U | 6/2020 | |
| JP | 3911923 B2 | 5/2007 | |
| JP | 2009205706 A | 9/2009 | |

* cited by examiner

SHIFT REGISTER AND DRIVING METHOD THEREOF, GATE DRIVER CIRCUIT AND DISPLAY APPARATUS

CROSS-REFERENCE TO RELATED APPLICATIONS

This application is a national phase entry under 35 USC 371 of International Patent Application No. PCT/CN2020/142087 filed on Dec. 31, 2020, which claims priority to Chinese Patent Application No. 202020004881.5, filed on Jan. 2, 2020, which are incorporated herein by reference in their entirety.

TECHNICAL FIELD

The present disclosure relates to the field of display technologies, and in particular, to a shift register and a driving method thereof, a gate driver circuit, and a display apparatus.

BACKGROUND

A gate driver circuit is a circuit for outputting scan driving signals (or gate signals) to a plurality of gate signal lines (or referred to as gate lines) in a display apparatus row by row. The gate driver circuit is integrated in a display panel in the display apparatus, so as to reduce production cost and manufacturing process difficulty of the display panel.

SUMMARY

In an aspect, a shift register is provided. The shift register includes: a first input sub-circuit electrically connected to an input signal terminal, a first voltage signal terminal, a first clock signal terminal and a first node, and the first input sub-circuit being configured to transmit a first clock signal received at the first clock signal terminal to the first node in response to an input signal received at the input signal terminal and a first voltage signal received at the first voltage signal terminal, a first output sub-circuit electrically connected to the first node, a second voltage signal terminal and a first output signal terminal, and the first output sub-circuit being configured to transmit a second voltage signal received at the second voltage signal terminal to the first output signal terminal under control of a voltage of the first node, so that the first output signal terminal outputs the second voltage signal; a second input sub-circuit electrically connected to the input signal terminal, the first clock signal terminal and a second node, and the second input sub-circuit being configured to transmit the input signal received at the input signal terminal to the second node in response to the first clock signal; and a second output sub-circuit electrically connected to the second node, the first voltage signal terminal, and the first output signal terminal, and the second output sub-circuit being configured to transmit the first voltage signal received at the first voltage signal terminal to the first output signal terminal under control of a voltage of the second node, so that the first output signal terminal outputs the first voltage signal. A voltage value of one of the first voltage signal and the second voltage signal is greater than that of a reference voltage, and a voltage value of another one of the first voltage signal and the second voltage signal is less than that of the reference voltage.

In some embodiments, the first input sub-circuit includes a first transistor, a second transistor, and a first capacitor. A gate of the first transistor is electrically connected to the input signal terminal, a first electrode of the first transistor is electrically connected to the first voltage signal terminal, and a second electrode of the first transistor is electrically connected to a third node. A gate of the second transistor is electrically connected to the third node, a first electrode of the second transistor is electrically connected to the first clock signal terminal, and a second electrode of the second transistor is electrically connected to the first node. A first terminal of the first capacitor is electrically connected to the first clock signal terminal, and a second terminal of the first capacitor is electrically connected to the third node. The second input sub-circuit includes a third transistor. A gate of the third transistor is electrically connected to the first clock signal terminal, a first electrode of the third transistor is electrically connected to the input signal terminal, and a second electrode of the third transistor is electrically connected to the second node.

In some embodiments, the first output sub-circuit includes a fourth transistor and a second capacitor. A gate of the fourth transistor is electrically connected to the first node, a first electrode of the fourth transistor is electrically connected to the second voltage signal terminal, and a second electrode of the fourth transistor is electrically connected to the first output signal terminal. A first terminal of the second capacitor is electrically connected to the first node, and a second terminal of the second capacitor is electrically connected to the second voltage signal terminal. The second output sub-circuit includes a fifth transistor and a third capacitor. A gate of the fifth transistor is electrically connected to the second node, a first electrode of the fifth transistor is electrically connected to the first voltage signal terminal, and a second electrode of the fifth transistor is electrically connected to the first output signal terminal. A first terminal of the third capacitor is electrically connected to the second node, and a second terminal of the third capacitor is electrically connected to the first voltage signal terminal.

In some embodiments, the shift register further includes a control sub-circuit. The control sub-circuit is electrically connected to the first voltage signal terminal, the second node, and the first node. The control sub-circuit is configured to transmit the first voltage signal received at the first voltage signal terminal to the first node under control of the voltage of the second node, so as to control the first output sub-circuit to be turned off in a period when the second output sub-circuit outputs the first voltage signal.

In some embodiments, the control sub-circuit includes a sixth transistor. A gate of the sixth transistor is electrically connected to the second node, a first electrode of the sixth transistor is electrically connected to the first voltage signal terminal, and a second electrode of the sixth transistor is electrically connected to the first node.

In some embodiments, the shift register further includes a level reduction sub-circuit. The level reduction sub-circuit is electrically connected to the second voltage signal terminal and the first output signal terminal. The level reduction sub-circuit is configured to reduce a level of the second voltage signal output by the first output signal terminal in cooperation with the first output sub-circuit in a period when the first output sub-circuit outputs the second voltage signal.

In some embodiments, the level reduction sub-circuit includes a seventh transistor. A gate of the seventh transistor is electrically connected to the first output signal terminal, a first electrode of the seventh transistor is electrically connected to the second voltage signal terminal, and a second electrode of the seventh transistor is electrically connected to the first output signal terminal.

In some embodiments, the shift register further includes a potential stabilization sub-circuit. The potential stabilization sub-circuit is electrically connected to the second voltage signal terminal, the second node and a fourth node. The potential stabilization sub-circuit is configured to transmit the voltage of the second node to the fourth node in response to the second voltage signal and stabilize a voltage of the fourth node. The second output sub-circuit is electrically connected to the fourth node, and is electrically connected to the second node through the potential stabilization sub-circuit.

In some embodiments, the potential stabilization sub-circuit includes an eighth transistor. A gate of the eighth transistor is electrically connected to the second voltage signal terminal, a first electrode of the eighth transistor is electrically connected to the second node, and a second electrode of the eighth transistor is electrically connected to the fourth node. In a case where the second output sub-circuit includes a fifth transistor and a third capacitor, a gate of the fifth transistor is electrically connected to the fourth node, and is electrically connected to the second node through the eighth transistor. A first terminal of the third capacitor is electrically connected to the fourth node, and is electrically connected to the second node through the eighth transistor.

In some embodiments, the shift register further includes: a first inversion sub-circuit electrically connected to the first output signal terminal, the first voltage signal terminal, and a second output signal terminal, and the first inversion sub-circuit being configured to transmit the first voltage signal received at the first voltage signal terminal to the second output signal terminal in response to a signal received at the first output signal terminal; and a second inversion sub-circuit electrically connected to the first output signal terminal, the second voltage signal terminal, a second clock signal terminal, and the second output signal terminal, and the second inversion sub-circuit being configured to transmit the second voltage signal received at the second voltage signal terminal to the second output signal terminal in response to the signal received at the first output signal terminal and a second clock signal received at the second clock signal terminal.

In some embodiments, the first inversion sub-circuit includes a ninth transistor. A gate of the ninth transistor is electrically connected to the first output signal terminal, a first electrode of the ninth transistor is electrically connected to the first voltage signal terminal, and a second electrode of the ninth transistor is electrically connected to the second output signal terminal. The second inversion sub-circuit includes a tenth transistor, an eleventh transistor, a twelfth transistor, and a fourth capacitor. A gate of the tenth transistor is electrically connected to the first output signal terminal, a first electrode of the tenth transistor is electrically connected to the first voltage signal terminal, and a second electrode of the tenth transistor is electrically connected to a fifth node. A gate of the eleventh transistor is electrically connected to the second clock signal terminal, a first electrode of the eleventh transistor is electrically connected to the second voltage signal terminal, and a second electrode of the eleventh transistor is electrically connected to the fifth node. A gate of the twelfth transistor is electrically connected to the fifth node, a first electrode of the twelfth transistor is electrically connected to the second voltage signal terminal, and a second electrode of the twelfth transistor is electrically connected to the second output signal terminal. A first terminal of the fourth capacitor is electrically connected to the fifth node, and a second terminal of the fourth capacitor is electrically connected to the second output signal terminal.

In another aspect, a driving method of the shift register according to any one of the embodiments is provided, the method including: in a first output period, transmitting, by the first output sub-circuit, the second voltage signal received at the second voltage signal terminal to the first output signal terminal when the first output sub-circuit is turned on under the control of the voltage of the first node, so that the first output signal terminal outputs the second voltage signal, and turning off the second output sub-circuit under the control of the voltage of the second node; and in a second output period, turning off the first output sub-circuit under the control of the voltage of the first node; and transmitting, by the second output sub-circuit, the first voltage signal received at the first voltage signal terminal to the first output signal terminal when the second output sub-circuit is turned on under the control of the voltage of the second node, so that the first output signal terminal outputs the first voltage signal.

In yet another aspect, a gate driver circuit is provided. The gate driver circuit includes a plurality of cascaded shift registers each according to any one of the embodiments.

In some embodiments, the gate driver circuit further comprising a first sub-clock signal line, a second sub-clock signal line, and a third sub-clock signal line. An input signal terminal of a first stage of shift register is electrically connected to the first sub-clock signal line; except for the first stage of shift register, for other stages of shift registers, an input signal terminal of any stage of shift register is electrically connected to a first output signal terminal of a previous stage of shift register. First clock signal terminals of odd stages of shift registers are electrically connected to the second sub-clock signal line, and first clock signal terminals of even stages of shift registers are electrically connected to the third sub-clock signal line.

In some embodiments, in a case where the shift register further includes the first inversion sub-circuit and second inversion sub-circuit, the gate driver circuit further includes a first sub-clock signal line, a second sub-clock signal line, a third sub-clock signal line, a fourth sub-clock signal line and a fifth sub-clock signal line. An input signal terminal of a first stage of shift register is electrically connected to the first sub-clock signal line; except for the first stage of shift register, for other stages of shift registers, an input signal terminal of any stage of shift register is electrically connected to a second output signal terminal of a previous stage of shift register. First clock signal terminals of odd stages of shift registers are electrically connected to the second sub-clock signal line, and second clock signal terminals of the odd stages of shift registers are electrically connected to the fourth sub-clock signal line. First clock signal terminals of even stages of shift registers are electrically connected to the third sub-clock signal line, and second clock signal terminals of the even stages of shift registers are electrically connected to the fifth sub-clock signal line.

In yet another aspect, a display apparatus is provided. The display apparatus includes the gate driver circuit according to any one of the embodiments.

In some embodiments, the display apparatus further includes a plurality of pixel driving circuits. The plurality of pixel driving circuits are arranged in rows in a first direction, and a row of pixel driving circuits includes at least two pixel driving circuits. In the gate driver circuit, an input signal terminal of one shift register is electrically connected to first scan signal terminals of one row of pixel driving circuits, and a first output signal terminal of the shift register is electrically connected to second scan signal terminals of the row of pixel driving circuits.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on actual sizes of products, actual processes of methods and actual timings of signals to which the embodiments of the present disclosure relate.

DETAILED DESCRIPTION

Figure 1:
FIG. 1 is a structural diagram of a display apparatus, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment", "some embodiments", "exemplary embodiments", "an example", "a specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are only used for descriptive purposes, and are not to be construed as indicating or implying the relative importance or implicitly indicating the number of indicated technical features. Thus, features defined as "first" or "second" may explicitly or implicitly include one or more of the features. In the description of the embodiments of the present disclosure, term "a plurality of" or "the plurality of" means two or more unless otherwise specified.

In the description of some embodiments, the expressions such as "connected" and its derivative extensions may be used. For example, the term "connected" may be used in the description of some embodiments to indicate that two or more components are in direct physical contact or electrical contact with each other. The embodiments disclosed herein are not necessarily limited to the contents herein.

In the description of some embodiments, "an electrical connection between A and B" may mean that A and B are directly electrically connected, or that C is provided between A and B, and A and B are indirectly electrically connected through C.

As used herein, the term "if" is optionally construed as "when" or "in a case where" or "in response to determining that" or "in response to detecting", depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]", depending on the context.

The use of the phrase "applicable to" or "configured to" herein means an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

Terms such as "about", "substantially" or "approximately" as used herein includes a stated value and an average value within an acceptable range of deviation of a particular value. The acceptable range of deviation is determined by a person of ordinary skill in the art in view of measurement in question and error associated with the measurement of a particular quantity (i.e., limitations of a measurement system).

Exemplary embodiments are described herein with reference to cross-sectional views and/or plan views as idealized exemplary drawings. In the accompanying drawings, thicknesses of layers and sizes of regions are enlarged for clarity. Variations in shape with respect to the drawings due to, for example, manufacturing technologies and/or tolerances may be envisaged. Therefore, the exemplary embodiments should not be construed as being limited to the shapes of the regions shown herein, but including deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

The transistors used in the circuits provided in the embodiments of the present disclosure may be thin film transistors, field effect transistors, or other switching devices with the same characteristics. In the embodiments of the present disclosure, the thin film transistors are taken as examples for description.

In some embodiments, a control electrode of each transistor used in the shift register is a gate of the transistor, a first electrode of the transistor is one of a source and a drain of the transistor, and a second electrode of the transistor is the other of the source and the drain of the transistor. Since the source and the drain of the transistor may be symmetrical in structure, there may be no difference in structure between the source and the drain of the transistor. That is, there may be no difference in structure between the first electrode and the second electrode of the transistor in the embodiments of the present disclosure. For example, in a case where the transistor is a P-type transistor, the first electrode of the transistor is the source, and the second electrode of the transistor is the drain. For example, in a case where the transistor is an N-type transistor, the first electrode of the transistor is the drain, and the second electrode of the transistor is the source.

In the circuits provided in the embodiments of the present disclosure, "nodes" do not represent actual components, but rather represent junctions of related electrical connections in a circuit diagram. That is, these nodes are nodes equivalent to the junctions of the related electrical connections in the circuit diagram.

In some embodiments of the present disclosure, a shift register 100 and a driving method thereof, a gate driver circuit 1000, and a display apparatus 2000 are provided. The shift register 100, the driving method of the shift register 100, the gate driver circuit 1000, and the display apparatus 2000 will be described below.

In some embodiments of the present disclosure, as shown in FIG. 1, the display apparatus 2000 is provided. The display apparatus may be any apparatus that displays images whether in motion (e.g., a video) or fixed (e.g., a static image), and regardless of literal or graphical. More specifically, it is contemplated that the described embodiments may be implemented in or associated with a variety of electronic devices. The variety of electronic devices may include (but not limit to), for example, mobile telephones, wireless devices, personal digital assistants (PDAs), hand-held or portable computers, global positioning system (GPS) receivers/navigators, cameras, MPEG-4 Part 14 (MP4) video players, video cameras, game consoles, watches, clocks, calculators, TV monitors, flat panel displays, computer monitors, car displays (e.g., odometer displays), navigators, cockpit controllers and/or displays, camera view displays (e.g., display of rear view camera in a vehicle), electronic photos, electronic billboards or signages, projectors, building structures, packaging and aesthetic structures (e.g., displays for an image of a piece of jewelry).

In some examples, the display apparatus 2000 includes a display panel PNL. Of course, the display apparatus 2000 may further include a frame, a circuit board, a display driver integrated circuit (IC), other electronic accessories, etc. The display panel PNL may be arranged in the frame.

The display apparatus 2000 may be, for example, an organic light emitting diode (OLED) display apparatus, a quantum dot light emitting diode (QLED) display apparatus, a micro light emitting diode (Micro LED) display apparatus or a mini light emitting diode (Mini LED) display apparatus, which is not specifically limited in the present disclosure. The display apparatus 2000 is increasingly used in the field of high-performance displays due to its characteristics of small size, low power consumption, good display effect, no radiation, relatively low manufacturing cost, etc.

Hereinafter, some embodiments of the present disclosure are schematically described by taking an example in which the display apparatus 2000 is the OLED display apparatus. On this basis, the display panel PNL included in the display apparatus 2000 is the OLED display panel.

Figure 2:
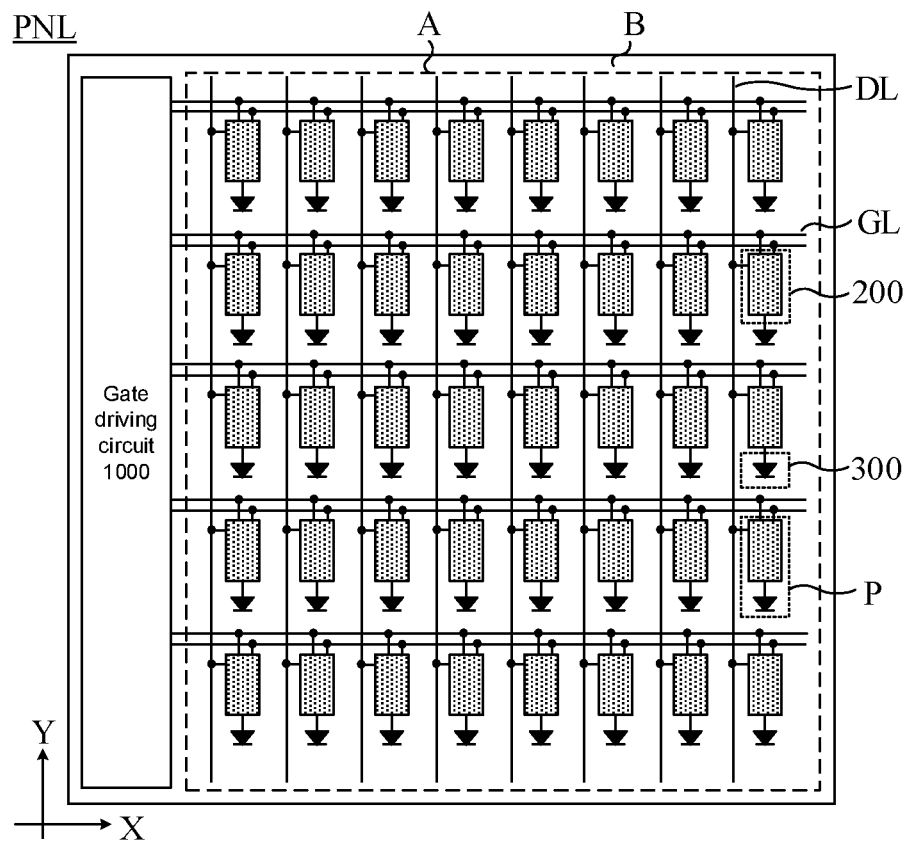
FIG. 2 is a structural diagram of a display panel, in accordance with some embodiments of the present disclosure.

In some embodiments, as shown in FIG. 2, the display panel PNL has a display area A and a peripheral area B disposed at side(s) of the display area A. The term "side(s)" refers to one side, two sides, three sides, or surrounding sides of the display area A. That is, the peripheral area B may be located at one side, two sides, or three sides of the display area A, or, the peripheral area B may be located around the display area A.

In some examples, as shown in FIG. 2, the display panel PNL may include a plurality of sub-pixels P, a plurality of gate lines GL extending in a first direction X, and a plurality of data lines DL extending in a second direction Y.

As shown in FIG. 2, in the display panel PNL the plurality of sub-pixels P may be arranged in an array.

For example, sub-pixels P arranged in a line in the first direction X may be referred to as a same row of sub-pixels P, and sub-pixels P arranged in a line in the second direction Y may be referred to as a same column of sub-pixels P. The same row of sub-pixels P may be electrically connected to at least one gate line GL, and the same column of sub-pixels P may be electrically connected to one data line DL. The number of gate lines GL electrically connected to the same row of sub-pixels P may be set according to a structure of the sub-pixel P.

In some examples, as shown in FIG. 2, the gate driver circuit 1000 may be disposed in the peripheral area B and located at a side of the display area A in a direction in which the plurality of gate lines GL extend. The gate driver circuit 1000 may be electrically connected to the plurality of gate lines GL, and may output output signals to the plurality of gate lines GL, so as to drive the plurality of sub-pixels P for image display. Of course, the gate driver circuit 1000 may also be disposed in the display area A.

For example, the gate driver circuit 1000 may be a gate driver IC.

For example, the gate driver circuit 1000 may also be a gate driver on array (GOA) circuit. That is, the gate driver circuit 1000 is directly integrated in an array substrate of the display panel PNL. Compared to a situation that the gate driver circuit 1000 is arranged as the gate driver IC, the gate driver circuit 1000 arranged as the GOA circuit may, in an aspect, reduce the manufacturing cost of the display panel PNL, in another aspect, reduce a bezel sizes of the display panel PNL to achieve a narrow bezel design.

As shown in FIG. 2, the following embodiments are all described by taking an example in which the gate driver circuit 1000 is the GOA circuit.

In some examples, the sub-pixel P is of a variety of structures, which may be selected and set according to actual needs.

Figure 3:
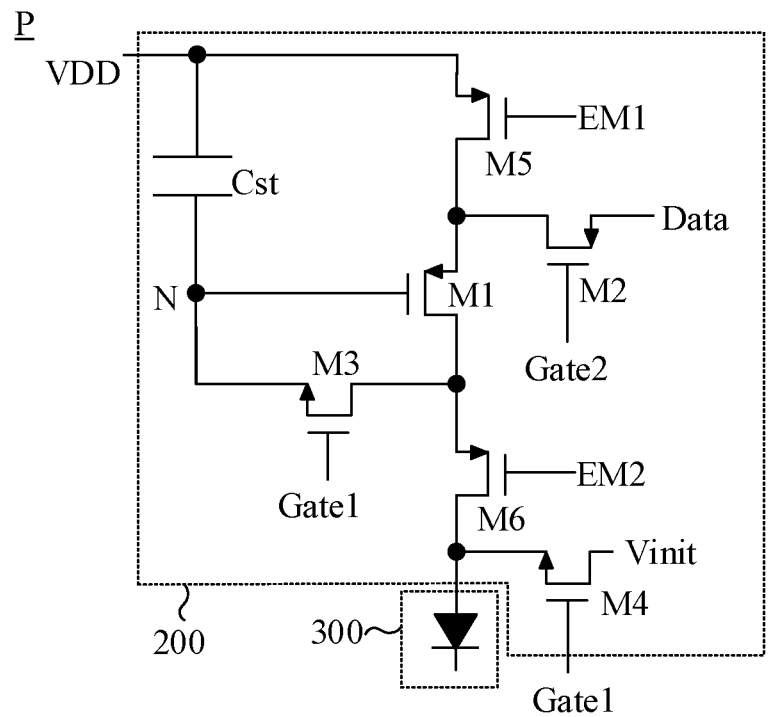
FIG. 3 is a structural diagram of a pixel driving circuit, in accordance with some embodiments of the present disclosure.

For example, as shown in FIGS. 2 and 3, each sub-pixel P may include a pixel driving circuit 200 and an element 300 to be driven electrically connected to the pixel driving circuit 200. The element 300 to be driven may be a current-driven type light-emitting device.

Further, the element 300 to be driven may be a current mode light-emitting diode. For example, the current mode light-emitting diode may be a micro light-emitting diode, a mini light-emitting diode, an organic light-emitting diode, or a quantum dot light-emitting diode.

In an implementation manner, the pixel driving circuit 200 may be of a 7T1C structure. "T" represents a transistor, and "C" represents a storage capacitor; the number in front of "T" represents the number of transistors, and the number in front of "C" represents the number of storage capacitors.

As a resolution of the display apparatus improves, an area occupied by the sub-pixels of the display panel in the display apparatus will be reduced. Since the pixel driving circuit with the 7T1C structure includes a large number of element structures (i.e., the transistors and the storage capacitors), it is difficult to reduce an area occupied by the pixel driving circuit. As a result, it is difficult to improve the resolution of the display apparatus.

On this basis, as shown in FIG. 3, in some embodiments of the present disclosure, a pixel driving circuit 200 is provided. The pixel driving circuit 200 has a structure different from the pixel driving circuit with the 7T1C structure.

In some examples, as shown in FIG. 3, the pixel driving circuit 200 provided by the present disclosure may be of a 6T1C structure. The pixel driving circuit 200 may include a first pixel transistor (which may also be referred to as a driving transistor) M1, a second pixel transistor M2, a third pixel transistor M3, a fourth pixel transistor M4, a fifth pixel transistor M5, a sixth pixel transistor M6, and a storage capacitor Cst.

For example, as shown in FIG. 3, a gate of the driving transistor M1 is electrically connected to a node N, a first electrode of the driving transistor M1 is electrically connected to a second electrode of the fifth pixel transistor M5, and a second electrode of the driving transistor M1 is electrically connected to a first electrode of the third pixel transistor M3 and a first electrode of the sixth pixel transistor M6. A gate of the second pixel transistor M2 is electrically connected to a second scan signal terminal Gate2, a first electrode of the second pixel transistor M2 is electrically connected to a data signal terminal Data, and a second electrode of the second pixel transistor M2 is electrically connected to the first electrode of the driving transistor M1. A gate of the third pixel transistor M3 is electrically connected to a first scan signal terminal Gate1, and a second electrode of the third pixel transistor M3 is connected to the node N. A gate of the fourth pixel transistor M4 is electrically connected to the first scan signal terminal Gate1, a first electrode of the fourth pixel transistor M4 is electrically connected to a reset signal terminal Vinit, and a second electrode of the fourth pixel transistor M4 is electrically connected to an anode of the element 300 to be driven. A gate of the fifth pixel transistor M5 is electrically connected to a first enable signal terminal EM1, and a first electrode of the fifth pixel transistor M5 is electrically connected to a power supply voltage signal terminal VDD. A gate of the sixth pixel transistor M6 is electrically connected to a second enable signal terminal EM2, and a second electrode of the sixth pixel transistor M6 is electrically connected to the anode of the element 300 to be driven. One terminal of the storage capacitor Cst is electrically connected to the power supply voltage signal terminal VDD, and the other terminal of the storage capacitor Cst is electrically connected to the node N.

The plurality of transistors may be of the same type or different types, which may be selected and set according to actual needs.

For example, the plurality of transistors are of different types. For example, the third pixel transistor M3 and the fourth pixel transistor M4 may be N-type transistors, and the driving transistor M1, the second pixel transistor M2, the fifth pixel transistor M5, and the sixth pixel transistor M6 may be P-type transistors.

The pixel driving circuit 200 provided by the present disclosure has a simpler structure than the pixel driving circuit with the 7T1C structure, and the number of the element structures included in the pixel driving circuit 200 is smaller. Therefore, a size of the pixel driving circuit 200 with the 6T1C structure provided by the present disclosure may be smaller than that of the pixel driving circuit with the 7T1C structure. Correspondingly, a size of a sub-pixel P corresponding to the pixel driving circuit 200 with the 6T1C structure may also be smaller, which may effectively improve the resolution of the display panel PNL.

Since the pixel driving circuit 200 provided by the present disclosure has a structure different from the 7T1C structure, an operating timing required by the pixel driving circuit 200 provided in the present disclosure is different from an operating timing required by the pixel driving circuit with the 7T1C structure, and thus a structure of a shift register 100 matched with the pixel driving circuit 200 provided by the present disclosure is different from a structure of a shift register matched with the pixel driving circuit with the 7T1C structure.

Figure 4:
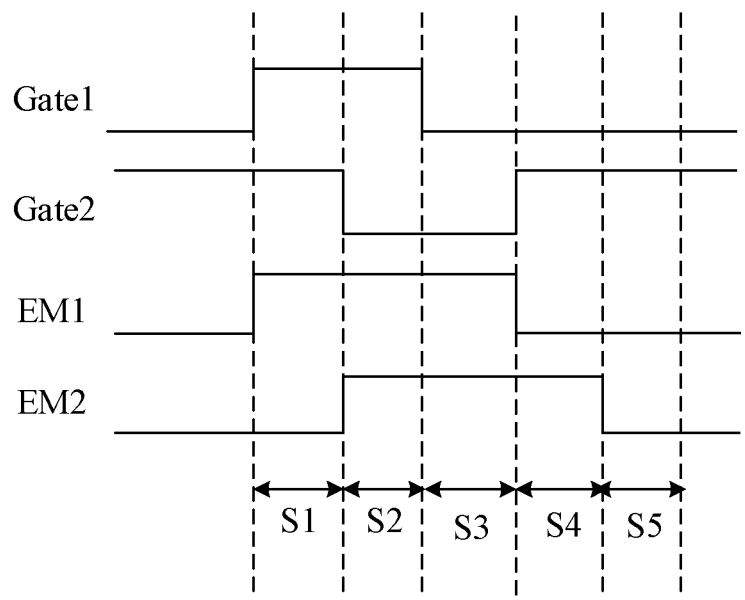
FIG. 4 is a timing diagram of a pixel driving circuit, in accordance with some embodiments of the present disclosure.

After research by inventors of the present disclosure, the operating timing suitable for the pixel driving circuit 200 provided by the present disclosure may be as shown in FIG. 4.

An operating process of the pixel driving circuit 200 provided by the present disclosure is schematically described below with reference to FIGS. 3 and 4.

In an S1 period, a level of a first scan signal provided by the first scan signal terminal Gata1 is a high level, and the third pixel transistor M3 and the fourth pixel transistor M4 may be turned on under control of the first scan signal. The fourth pixel transistor M4 may transmit a reset signal received at the reset signal terminal Vinit to the anode of the element 300 to be driven, so as to reset the anode of the element 300 to be driven.

In addition, a level of a second enable signal provided by the second enable signal terminal EM2 is a low level, and the sixth pixel transistor M6 may be turned on under control of the second enable signal, so as to receive and transmit the reset signal to the first electrode of the sixth pixel transistor M6. The third pixel transistor M3 may receive and transmit the reset signal to the node N.

In an S2 period, the level of the first scan signal is still a high level, and the third pixel transistor M3 remains a turned-on state. The level of the second enable signal changes to a high level, and the sixth pixel transistor M6 is turned off under control of the second enable signal.

A level of a second scan signal provided by the second scan signal terminal Gata2 is a low level, and the second pixel transistor M2 may be turned on under control of the second scan signal, so as to transmit a data signal received at the data signal terminal Data to the second electrode of the second pixel transistor M2.

A voltage of the node N changes to a low level due to an action of the reset signal. The driving transistor M1 may be turned on under control of the node N, so as to receive the data signal from the second electrode of the second pixel transistor M2, and transmit the data signal to the node N.

In this period, the data signal is continuously transmitted to the node N and the storage capacitor Cst is continuously charged until a difference value between an absolute value of Vgs (a voltage difference between the gate and the first electrode of the driving transistor M1) and an absolute value of Vth (a threshold voltage of the driving transistor M1) is less than zero, so that the driving transistor M1 is turned off. At this time, the threshold voltage of the driving transistor M1 is written into the node N, so as to achieve a compensation for the threshold voltage of the driving transistor M1.

In an S3 period, the level of the first scan signal changes to a low level, and the third pixel transistor M3 is turned off under control of the first scan signal. The level of the second scan signal is still a low level, and the second pixel transistor M2 remains a turned-on state, and continues to transmit the data signal to the first electrode of the driving transistor M1.

In an S4 period, the level of the second scan signal changes to a high level, and the second pixel transistor M2 is turned off under control of the second scan signal.

A level of a first enable signal provided by the first enable signal terminal EM1 changes to a low level, and the fifth pixel transistor M5 is turned on under control of the first enable signal, so as to transmit a power supply voltage signal transmitted by the power supply voltage signal terminal VDD to the first electrode of the driving transistor M1.

In an S5 period, the second enable signal provided by the second enable signal terminal EM2 is a low level, and the sixth pixel transistor M6 is turned on under control of the second enable signal, so that the driving transistor M1 is electrically connected to the element 300 to be driven, and the element 300 to be driven starts to emit light under driving of a current provided by the driving transistor M1.

In a process of driving the element 300 to be driven to emit light, the first scan signal terminal Gate1 and the second scan signal terminal Gate2 in the pixel driving circuit 200 need to be respectively provided with a first scan signal and a second scan signal with waveforms shown in FIG. 4. A time interval between the first scan signal and the second scan signal is, for example, within a range of 1H to 2H, and H is time required for the data signal provided by the data signal terminal Data to be written into a row of sub-pixels P.

On this basis, in some embodiments of the present disclosure, a shift register 100 that may transmit the first scan signal and the second scan signal to the pixel driving circuit 200 is provided.

Hereinafter, in circuits provided by the embodiments of the present disclosure, the structure of the shift register 100 is schematically illustrated by taking an example in which the transistors are all P-type transistors. Of course, the transistors may also be N-type transistors, or some of the transistors are P-type transistors, and some of the transistors are N-type transistors, which is not limited in this disclosure.

Those skilled in the art may understand that, in a case where the transistors are of different types, corresponding timing diagrams may also be different. Therefore, the timing diagrams in this disclosure are not limited thereto.

In some embodiments, as shown in FIGS. 5 to 21, the shift register 100 includes a first input sub-circuit 1, a second input sub-circuit 3, a first output sub-circuit 2 and a second output sub-circuit 4.

In some examples, as shown in FIGS. 5 to 21, the first input sub-circuit 1 is electrically connected to an input signal terminal Input, a first voltage signal terminal VGH, a first clock signal terminal CK1, and a first node Q1. The input signal terminal Input is used for receiving an input signal and transmitting the input signal to the first input sub-circuit 1. The first voltage signal terminal VGH is used for receiving a first voltage signal and transmitting the first voltage signal to the first input sub-circuit 1. The first clock signal terminal CK1 is used for receiving a first clock signal and transmitting the first clock signal to the first input sub-circuit 1. The first input sub-circuit 1 is configured to transmit the first clock signal received at the first clock signal terminal CK1 to the first node Q1 in response to the input signal received at the input signal terminal Input and the first voltage signal received at the first voltage signal terminal VGH.

For example, in a case where a level of the input signal and a level of the first voltage signal are levels required for the first input sub-circuit 1 to be turned on, the first input sub-circuit 1 may be turned on under joint control of the input signal and the first voltage signal, so as to receive and transmit the first clock signal to the first node Q1.

In some examples, as shown in FIGS. 5 to 21, the first output sub-circuit 2 is electrically connected to the first node Q1, a second voltage signal terminal VGL, and a first output signal terminal Out1. The second voltage signal terminal VGL is used for receiving a second voltage signal and transmitting the second voltage signal to the first output sub-circuit 2. The first output sub-circuit 2 is configured to transmit the second voltage signal received at the second voltage signal terminal VGL to the first output signal terminal Out1 under control of a voltage of the first node Q1.

For example, in a case where the voltage of the first node Q1 is a voltage required for the first output sub-circuit 2 to be turned on, the first output sub-circuit 2 may be turned on under control of the voltage of the first node Q1, so as to receive and transmit the second voltage signal to the first output signal terminal Out1.

During a period when the first output sub-circuit 2 is turned on, the first output signal terminal Out1 may output the second voltage signal as the first output signal.

In some examples, as shown in FIGS. 5 to 21, the second input sub-circuit 3 is electrically connected to the input signal terminal Input, the first clock signal terminal CK1 and a second node Q2. The input signal terminal Input is further used for transmitting the input signal to the second input sub-circuit 3. The first clock signal terminal CK1 is further used for transmitting the first clock signal to the second input sub-circuit 3. The second input sub-circuit 3 is configured to transmit the input signal received at the input signal terminal Input to the second node Q2 in response to the first clock signal received at the first clock signal terminal CK1.

For example, in a case where a level of the first clock signal is a level required for the second input sub-circuit 3 to be turned on, the second input sub-circuit 3 may be turned on under control of the first clock signal, so as to receive and transmit the input signal to the second node Q2.

In some examples, as shown in FIGS. 5 to 21, the second output sub-circuit 4 is electrically connected to the second node Q2, the first voltage signal terminal VGH, and the first output signal terminal Out1. The first voltage signal terminal VGH is further used for transmitting the first voltage signal to the second output sub-circuit 4. The second output sub-circuit 4 is configured to transmit the first voltage signal received at the first voltage signal terminal VGH to the first output signal terminal Out1 under control of a voltage of the second node Q2.

For example, in a case where the voltage of the second node Q2 is a voltage required for the second output sub-circuit 4 to be turned on, the second output sub-circuit 4 may be turned on under control of the voltage of the second node Q2, so as to receive and transmit the first voltage signal to the first output signal terminal Out1.

During a period when the second output sub-circuit 4 is turned on, the first output signal terminal Out1 may output the first voltage signal as the first output signal.

In some examples, the first voltage signal and the second voltage signal are different. A voltage value of one of the first voltage signal and the second voltage signal is greater than that of a reference voltage, and a voltage value of the other one of the first voltage signal and the second voltage signal is less than that of the reference voltage. The value of reference voltage may be, for example, an average value of the voltage value of the first voltage signal and the voltage value of the second voltage signal.

For example, the first voltage signal is a gate-off voltage signal, and the second voltage signal is a gate-on voltage signal. In a case where the transistors included in the shift register 100 are all P-type transistors, the first voltage signal is, for example, a direct current (DC) high-level signal, and the second voltage signal is, for example, a DC low-level signal.

The high level and the low level in the present disclosure are relative values. For example, the high level is 15 V and the low level is 5 V. Therefore, the low level is not limited to a level less than or equal to 0 V.

For example, the voltage of the first voltage signal may be 6 V, the voltage of the second voltage signal may be −6 V, and the reference voltage may be 0 V.

Figure 5:
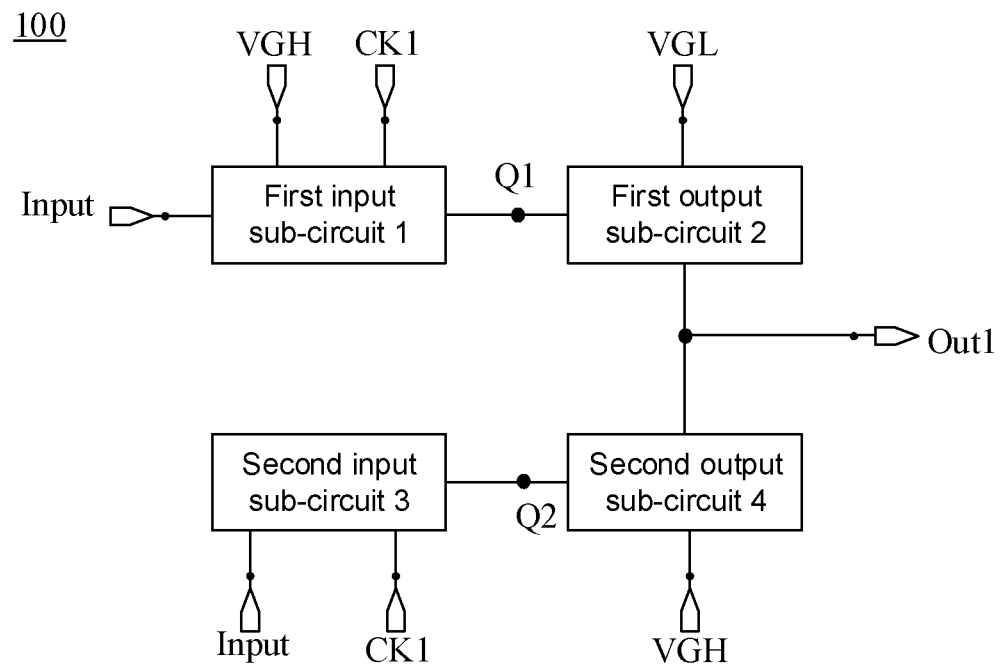
FIG. 5 is a structural diagram of a shift register, in accordance with some embodiments of the present disclosure.
Figure 6:
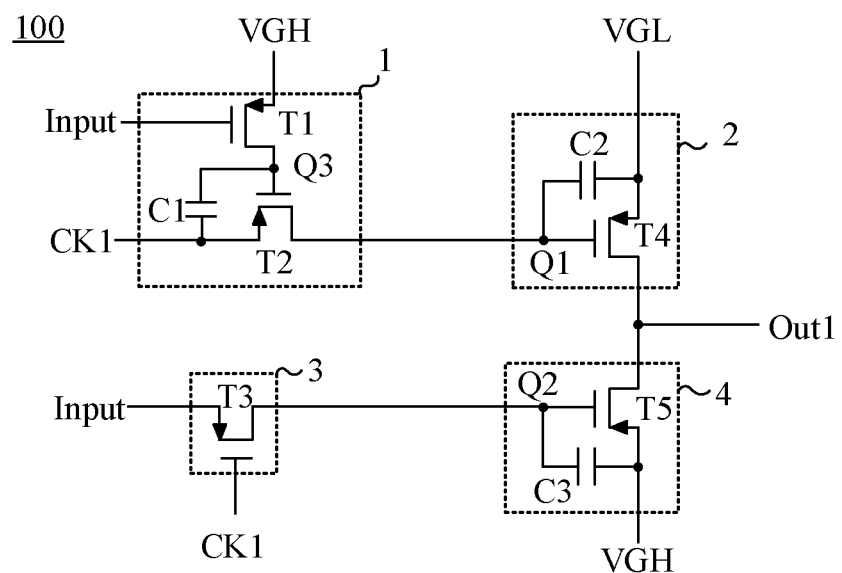
FIG. 6 is a circuit diagram of a shift register, in accordance with some embodiments of the present disclosure.
Figure 7:
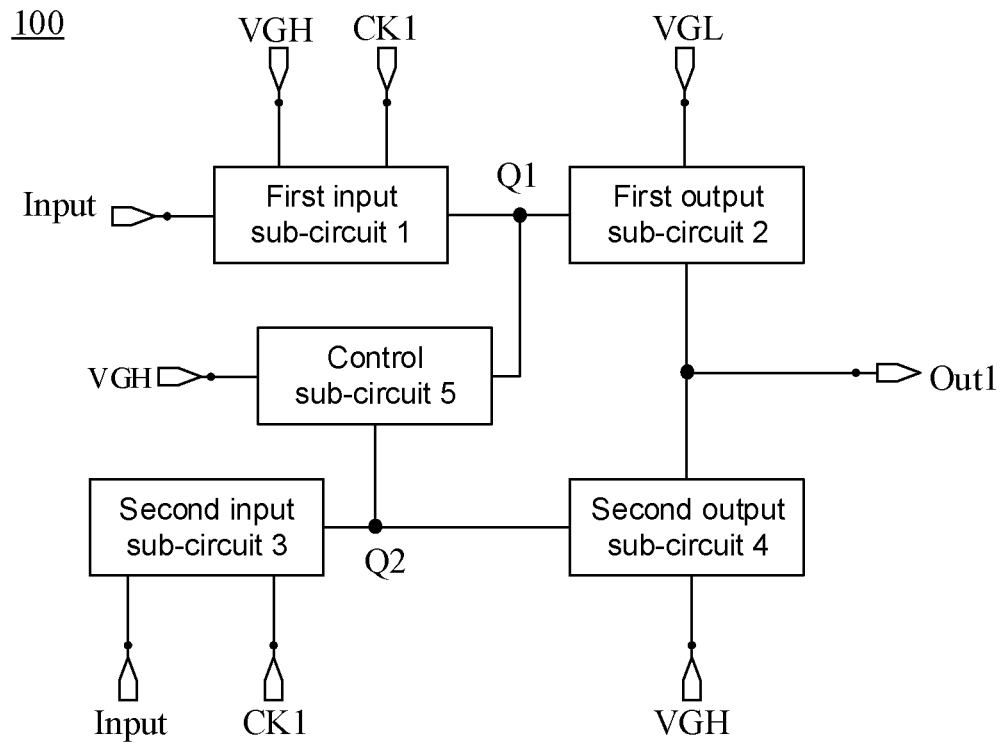
FIG. 7 is a structural diagram of another shift register, in accordance with some embodiments of the present disclosure.

As shown in FIGS. 5 and 6, the shift register 100 controls an output of the first output sub-circuit 2 through the first input sub-circuit 1 and controls an output of the second output sub-circuit 4 through the second input sub-circuit 3. The first output sub-circuit 2 and the second output sub-circuit 4 are turned on and output signals in different periods.

Figure 22:
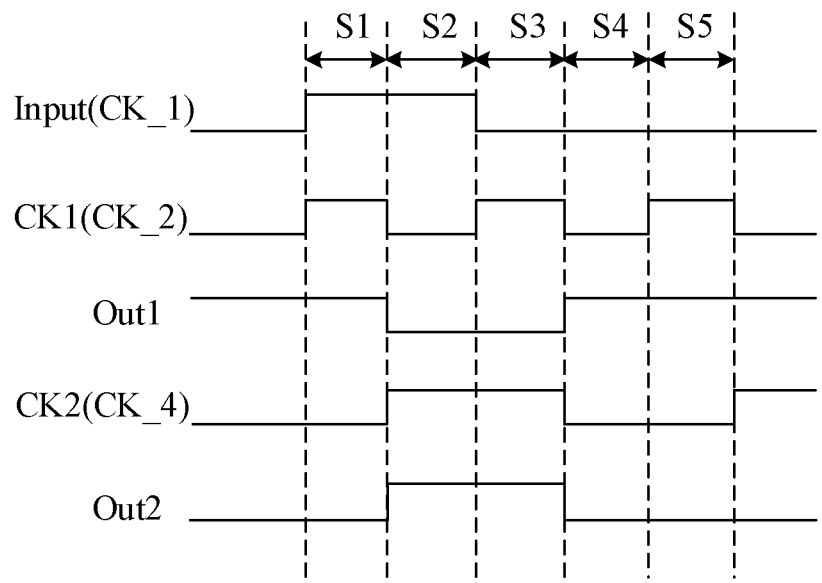
FIG. 22 is a timing diagram of a shift register, in accordance with some embodiments of the present disclosure.

For example, as shown in FIG. 22, the first output sub-circuit 2 is turned on earlier than the second output sub-circuit 4. The second voltage signal (the level is a low level) output by the first output sub-circuit 2 may be served as the first half of the first output signal (i.e., a portion corresponding to the S2 period and the S3 period), and the first voltage signal (the level is a high level) output by the second output sub-circuit 4 may be served as the second half of the first output signal (i.e., a portion corresponding to the S4 period and the S5 period). The second voltage signal and the first voltage signal may form the first output signal in order.

In some examples, a waveform of the input signal transmitted by the input signal terminal Input of the shift register 100 is the same as a waveform required by the first scan signal terminal Gate1 of the pixel driving circuit 200. A waveform of the first output signal output by the first output signal terminal Out1 of the shift register 100 is the same as a waveform required by the second scan signal terminal Gate2 of the pixel driving circuit 200.

In a case where the shift register 100 is electrically connected to the pixel driving circuits 200 of a corresponding row of sub-pixels P in the display panel PNL, the input signal terminal Input of the shift register 100 may be electrically connected to the first scan signal terminals Gate1 of the pixel driving circuits 200 in the corresponding row of sub-pixels P. That is, in the shift register 100, the input signal transmitted by the input signal terminal Input is served as the first scan signal of the corresponding pixel driving circuits 200. The first output signal terminal Out1 of the shift register 100 may be electrically connected to the second scan signal terminals Gate2 of the pixel driving circuits 200 in the corresponding row of sub-pixels P. That is, in the shift register 100, the first output signal output by the first output signal terminal Out1 is served as the second scan signal of the corresponding pixel driving circuits 200.

The shift register 100 are electrically connected with the pixel driving circuits 200 of the corresponding row of sub-pixels P, so that the shift register 100 may be used to provide the pixel driving circuits 200 of the corresponding row of sub-pixels P with required operating timings, so as to drive the corresponding row of sub-pixels P for display.

Therefore, in the shift register 100 provided by some embodiments of the present disclosure, the first input sub-circuit 1, the second input sub-circuit 3, the first output sub-circuit 2 and the second output sub-circuit 4 are arranged and are each electrically connected to their corresponding signal terminals. The first output sub-circuit 2 and the second output sub-circuit 4 may be turned on in different periods through mutual cooperation among the signal terminals, and the second voltage signal output by the first output sub-circuit 2 and the first voltage signal output by the second output sub-circuit 4 together constitute the first output signal.

The waveform of the input signal transmitted by the input signal terminal Input in the shift register 100 provided by the present disclosure is the same as the waveform required by the first scan signal terminal Gate1 of the pixel driving circuit 200, and the waveform of the first output signal output by the first output signal terminal Out1 is the same as the waveform required by the second scan signal terminal Gate2 of the pixel driving circuit 200, so that the shift register 100 may be used to provide the required first scan signal and second scan signal to the pixel driving circuit 200 with the 6T1C structure, so as to drive the corresponding sub-pixels P for display. That is, the shift register 100 provided in the present disclosure may be applied to the pixel driving circuit 200 with the 6T1C structure.

Structures of the first input sub-circuit 1, the first output sub-circuit 2, the second input sub-circuit 3 and the second output sub-circuit 4 are schematically described below.

In some examples, as shown in FIGS. 6, 8, 10, 12, 14, 16, and 18 to 21, the first input sub-circuit 1 includes a first transistor T1, a second transistor T2, and a first capacitor C1.

For example, as shown in FIG. 6, a gate of the first transistor T1 is electrically connected to the input signal terminal Input, a first electrode of the first transistor T1 is electrically connected to the first voltage signal terminal VGH, and a second electrode of the first transistor T1 is electrically connected to a third node Q3. The input signal transmitted by the input signal terminal Input may control the first transistor T1 to be turned on or turned off. The first transistor T1 is configured to transmit the first voltage signal received at the first voltage signal terminal VGH to the third node Q3 under control of the input signal.

For example, in a case where the level of the input signal is a low level, the first transistor T1 may be turned on under control of the input signal, so as to receive and transmit the first voltage signal to the third node Q3.

For example, as shown in FIG. 6, a gate of the second transistor T2 is electrically connected to the third node Q3 (in this way, the second electrode of the first transistor T1 is electrically connected to the gate of the second transistor T2), a first electrode of the second transistor T2 is electrically connected to the first clock signal terminal CK1, and a second electrode of the second transistor T2 is electrically connected to the first node Q1. The second transistor T2 is configured to transmit the first clock signal received at the first clock signal terminal CK1 to the first node Q1 under control of a voltage of the third node Q3.

For example, in a case where the voltage of the third node Q3 is a low level, the second transistor T2 may be turned on under control of the voltage of the third node Q3, so as to receive and transmit the first clock signal to the first node Q1.

For example, as shown in FIG. 6, a first terminal of the first capacitor C1 is electrically connected to the first electrode of the second transistor T2, and a second terminal of the first capacitor C1 is electrically connected to the third node Q3. The first capacitor C1 is configured to make the voltage of the third node Q3 hop with the first clock signal.

For example, in a case where the level of the first clock signal is a low level, the voltage of the third node Q3 may change to a low level due to an action of the first capacitor C1.

Here, the first input sub-circuit 1 may control an output condition of the signal of the first output sub-circuit 2. For example, in the first input sub-circuit 1, the first voltage signal output by the first transistor T1 may cooperate with the first capacitor C1 to control the second transistor T2 to be turned on or turned off, thereby controlling a transmission of the first clock signal to the first output sub-circuit 2. The first clock signal may control the first output sub-circuit 2 to be turned on or turned off, that is, the first clock signal may control a signal output condition of the first output sub-circuit 2.

In some examples, as shown in FIGS. 6, 8, 10, 12, 14, 16, and 18 to 21, the second input sub-circuit 3 includes a third transistor T3.

For example, as shown in FIG. 6, a gate of the third transistor T3 is electrically connected to the first clock signal terminal CK1, a first electrode of the third transistor T3 is electrically connected to the input signal terminal Input, and a second electrode of the third transistor T3 is electrically connected to the second node Q2. The first clock signal transmitted by the first clock signal terminal CK1 may control the third transistor T3 to be turned on or turned off. The third transistor T3 is configured to transmit the input signal received at the input signal terminal Input to the second node Q2 under control of the first clock signal.

For example, in the case where the level of the first clock signal is a low level, the third transistor T3 may be turned on under control of the first clock signal, so as to receive and transmit the first clock signal to the second node Q2. The input signal transmitted to the second node Q2 may further control a signal output condition of the second output sub-circuit 4.

The structures of the first input sub-circuit 1 and the second input sub-circuit 3 are relatively simple and easy to be fabricated, which is beneficial to decrease a size of the shift register 100 and a size of the peripheral area B, thereby achieving the narrow bezel design of the display apparatus 2000.

In some examples, as shown in FIGS. 6, 8, 10, 12, 14, 16, and 18 to 21, the first output sub-circuit 2 includes a fourth transistor T4 and a second capacitor C2.

For example, as shown in FIG. 6, a gate of the fourth transistor T4 is electrically connected to the first node Q1, a first electrode of the fourth transistor T4 is electrically connected to the second voltage signal terminal VGL, and a second electrode of the fourth transistor T4 is electrically connected to the first output signal terminal Out1. The first input sub-circuit 1 is electrically connected to the first node Q1, and the gate of the fourth transistor T4 is also electrically connected to the first node Q1. The first clock signal transmitted by the first input sub-circuit 1 to the first node Q1 may be further transmitted to the gate of the fourth transistor T4. The fourth transistor T4 is configured to transmit the second voltage signal received at the second voltage signal terminal VGL to the first output signal terminal Out1 under control of the voltage of the first node Q1.

For example, in a case where the voltage of the first node Q1 is a low level, the fourth transistor T4 may be turned on under control of the voltage of the first node Q1, so as to receive the second voltage signal provided by the second voltage signal terminal VGL and transmit the second voltage signal to the first output signal terminal Out1.

For example, as shown in FIG. 6, a first end of the second capacitor C2 is electrically connected to the first node Q1, and a second end of the second capacitor C2 is electrically connected to the second voltage signal terminal VGL. The second capacitor C2 is configured to store electric charges to maintain a potential of the first node Q1.

For example, during a process in which the first input sub-circuit 1 transmits the first clock signal to the first node Q1 to make the fourth transistor T4 turned on, the second capacitor C2 is also charged. After the first input sub-circuit 1 is turned off, the second capacitor C2 may be discharged to maintain the potential of the first node Q1, thereby making the fourth transistor T4 maintain a turned-on state.

In some examples, as shown in FIGS. 6, 8, 10, 12, 14, 16, and 18 to 21, the second output sub-circuit 4 includes a fifth transistor T5 and a third capacitor C3.

For example, as shown in FIG. 6, a gate of the fifth transistor T5 is electrically connected to the second node Q2, a first electrode of the fifth transistor T5 is electrically connected to the first voltage signal terminal VGH, and a second electrode of the fifth transistor T5 is electrically connected to the first output signal terminal Out1. The second input sub-circuit 3 is electrically connected to the second node Q2, and the gate of the fifth transistor T5 is also electrically connected to the second node Q2. The input signal transmitted from the second input sub-circuit 3 to the second node Q2 may be further transmitted to the gate of the fifth transistor T5. The fifth transistor T5 is configured to transmit the first voltage signal received at the first voltage signal terminal VGH to the first output signal terminal Out1 under control of the voltage of the second node Q2.

For example, in a case where the voltage of the second node Q2 is a low level, the fifth transistor T5 may be turned on under control of the voltage of the second node Q2, so as to receive the first voltage signal provided by the first voltage signal terminal VGH, and transmit the first voltage signal to the first output signal terminal Out1.

For example, as shown in FIG. 6, a first terminal of the third capacitor C3 is electrically connected to the second node Q2, and a second terminal of the third capacitor C3 is electrically connected to the first voltage signal terminal VGH. The third capacitor C3 is configured to store charges to maintain a potential of the second node Q2.

For example, during a process in which the second input sub-circuit 3 transmits the input signal to the second node Q2 to make the fifth transistor T5 turned on, the third capacitor C3 is also charged. After the second input sub-circuit 3 is turned off, the third capacitor C3 may be discharged to maintain the potential of the second node Q2, thereby making the fifth transistor T5 maintain a turned-on state.

In some embodiments, as shown in FIGS. 7 to 14 and 17 to 21, the shift register 100 further includes a control sub-circuit 5.

In some examples, as shown in FIGS. 7 to 14 and 17 to 21, the control sub-circuit 5 is electrically connected to the first voltage signal terminal VGH, the second node Q2 and the first node Q1. The control sub-circuit 5 is configured to transmit the first voltage signal received at the first voltage signal terminal VGH to the first node Q1 under control of the voltage of the second node Q2, so as to control the first output sub-circuit 2 to be turned off in a period when the second output sub-circuit 4 outputs the first output signal.

It can be seen from the above that the first output sub-circuit 2 and the second output sub-circuit 4 are turned on in different periods. During a period when the first output sub-circuit 2 is turned on, the second voltage signal may be output as the first output signal. During a period when the second output sub-circuit 4 is turned on, the first voltage signal may be output as the first output signal. If time for the second output sub-circuit 4 to output the first output signal (i.e., the first voltage signal) is relatively long, the voltage of the first node Q1 may decrease during a process in which the second output sub-circuit 4 outputs the first output signal. As a result, the first output sub-circuit 2 may output a signal (i.e., the second voltage signal), which will affect an accuracy of the first output signal and a stability of the shift register 100.

In the present disclosure, the control sub-circuit 5 is arranged, and thus it may be possible by using the control sub-circuit 5 to ensure that the first output sub-circuit 2 remains a turned-off state and not output the signal in a period when the second output sub-circuit 4 outputs the first output signal. In this way, the accuracy and stability of the output of the shift register 100 may be ensured, thereby ensuring the accuracy of the first output signal.

A structure of the control sub-circuit 5 is schematically described below.

In some examples, as shown in FIGS. 8, 10, 12, 14, and 18 to 21, the control sub-circuit 5 includes a sixth transistor T6.

Figure 8:
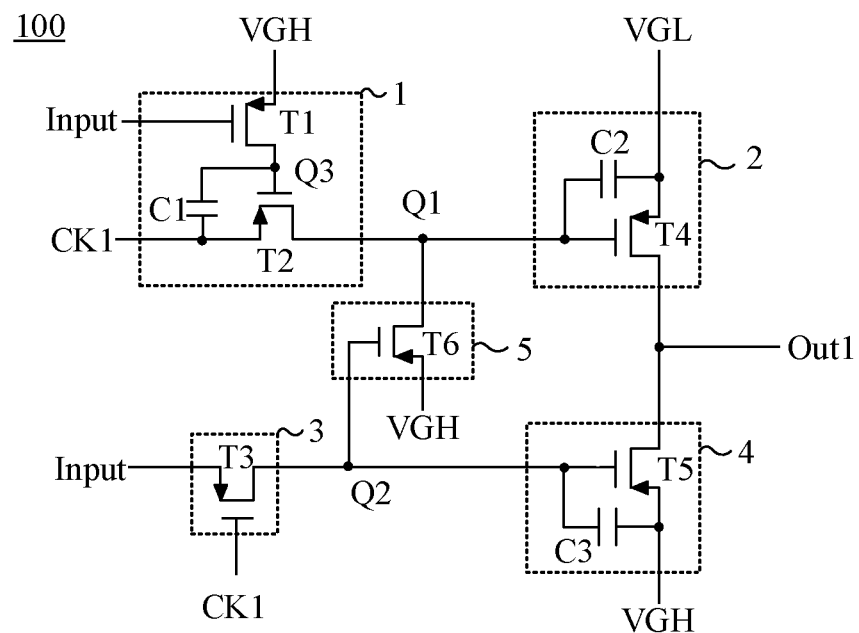
FIG. 8 is a circuit diagram of another shift register, in accordance with some embodiments of the present disclosure.
Figure 9:
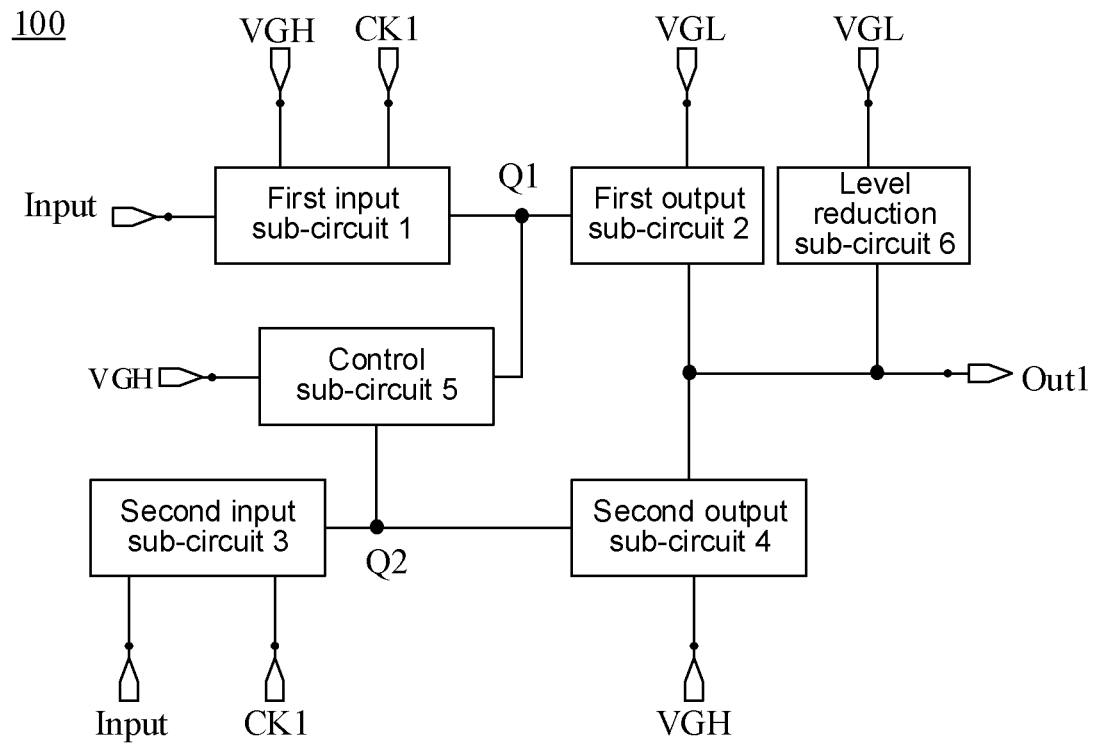
FIG. 9 is a structural diagram of yet another shift register, in accordance with some embodiments of the present disclosure.

For example, as shown in FIG. 8, a gate of the sixth transistor T6 is electrically connected to the second node Q2, a first electrode of the sixth transistor T6 is electrically connected to the first voltage signal terminal VGH, and a second electrode of the sixth transistor T6 is electrically connected to the first node Q1. The sixth transistor T6 is configured to transmit the first voltage signal received at the first voltage signal terminal VGH to the first node Q1 under control of the voltage of the second node Q2.

For example, in the case where the level of the second node Q2 is a low level, the sixth transistor T6 may be turned on under control of the voltage of the second node Q2, so as to transmit the first voltage signal provided by the first voltage signal terminal VGH to the first node Q1. Since the first voltage signal is a DC high-level signal, the voltage of the first node Q1 may increase due to an action of the first voltage signal, and the fourth transistor T4 may be turned off due to an action of the high-level first node Q1, so that there is no signal output by the first output sub-circuit 2.

Operating processes of the first input sub-circuit 1, the first output sub-circuit 2, the second input sub-circuit 3, the second output sub-circuit 4, and the control sub-circuit 5 included in the shift register 100 in the present disclosure are schematically illustrated below with reference to FIGS. 8 and 22.

As shown in FIG. 22, operating periods of the shift register 100 includes the S1 period, the S2 period, the S3 period, the S4 period and the S5 period. A sequence of the plurality of operating periods may be, for example, the S2 period, the S3 period, the S4 period, the S5 period, and the S1 period. A sum of time from the S1 period to the S5 period may be, for example, equal to time for the display panel PNL to display one frame of image. The S4 period and the S5 period will be cycled. Cycle time is related to the time for displaying one frame of image, and the time for displaying one frame of image is related to the resolution of the display panel PNL.

In the S2 period, as shown in FIGS. 8 and 22, the level of the input signal provided by the input signal terminal Input is a high level, and the first transistor T1 in the first input sub-circuit 1 is turned off under control of the input signal. The level of the first clock signal provided by the first clock signal terminal CK1 is a low level. In the first input sub-circuit 1, due to the action of the first capacitor C1, the voltage of the third node Q3 hops to a low level. The second transistor T2 may be turned on due to an action of the voltage of the third node Q3, and may receive and transmit the first clock signal to the first node Q1, so that the voltage of the first node Q1 decreases. The fourth transistor T4 electrically connected to the first node Q1 may be turned on due to the action of the first node Q1, so that the first output signal terminal Out1 outputs the second voltage signal provided by the second voltage signal terminal VGL.

The level of the first clock signal is a low level, and the level of the input signal is a high level. The third transistor T3 in the second input sub-circuit 3 is turned on under control of the first clock signal to receive and transmit the input signal to the second node Q2, so that the voltage of the second node Q2 increases. The sixth transistor T6 in the control sub-circuit 5 is turned off under control of the voltage of the second node Q2, and the fifth transistor T5 in the second output sub-circuit 4 is turned off under control of the voltage of the second node Q2, so that there is no signal output by the second output sub-circuit 4.

Therefore, in the S2 period, the first output signal output by the first output signal terminal Out1 is equal to the second voltage signal.

In the S3 period, as shown in FIGS. 8 and 22, the level of the input signal provided by the input signal terminal Input is a low level. The first transistor T1 is turned on under control of the input signal to transmit the first voltage signal received at the first voltage signal terminal VGH to the third node Q3, so that the voltage of the third node Q3 increases. The second transistor T2 is turned off under control of the voltage of the third node Q3, so that there is no signal output by the first input sub-circuit 1.

In the S2 period, during a process in which the second transistor T2 receives and transmits the low-level first clock signal to the first node Q1, the second capacitor C2 is also charged. In the S3 period, since the second capacitor C2 is discharged, the voltage of the first node Q1 remains the low level in the S2 period, which makes the fourth transistor T4 remains a turned-on state, thereby making the first output signal terminal Out1 outputs the second voltage signal provided by the second voltage signal terminal VGL.

The level of the first clock signal changes to a high level, and the third transistor T3 is turned off under control of the first clock signal.

In the S2 period, during a process in which the third transistor T3 receives and transmits the high-level input signal to the second node Q2, the third capacitor C3 is also charged. In the S3 period, since the third capacitor C3 is discharged, the voltage of the second node Q2 remains the high level in the S2 period, which makes the fifth transistor T5 remain a turned-off state. As a result, there is no signal output by the second output sub-circuit 4.

Therefore, in the S3 period, the first output signal output by the first output signal terminal Out1 is equal to the second voltage signal.

In the S4 period, as shown in FIGS. 8 and 22, the level of the input signal provided by the input signal terminal Input is a low level. The first transistor T1 is turned on under control of the input signal to transmit the first voltage signal received at the first voltage signal terminal VGH to the third node Q3, so that the voltage of the third node Q3 increases. The second transistor T2 is turned off under control of the voltage of the third node Q3, so that there is no signal output by the first input sub-circuit 1.

The level of the first clock signal is a low level, and the third transistor T3 is turned on under control of the first clock signal to receive and transmit the low-level input signal to the second node Q2, so that the voltage of the second node Q2 decreases. The sixth transistor T6 is turned on under control of the voltage of the second node Q2 to transmit the first voltage signal received at the first voltage signal terminal VGH to the first node Q1, so that the voltage of the first node Q1 increases, thereby ensuring that the fourth transistor T4 remains a turned-off state and there is no signal output by the first output sub-circuit 2. The fifth transistor T5 is turned on under control of the voltage of the second node Q2, so that the first output signal terminal Out1 outputs the first voltage signal provided by the first voltage signal terminal VGH.

Therefore, in the S4 period, the first output signal output by the first output signal terminal Out1 is equal to the first voltage signal.

In the S5 period, as shown in FIGS. 8 and 22, the level of the input signal provided by the input signal terminal Input is a low level. The first transistor T1 is turned on under control of the input signal to transmit the first voltage signal received at the first voltage signal terminal VGH to the third node Q3, so that the voltage of the third node Q3 increases. The second transistor T2 is turned off under control of the voltage of the third node Q3, so that there is no signal output by the first input sub-circuit 1.

The level of the first clock signal changes to a high level, and the third transistor T3 is turned off under control of the first clock signal.

In the S4 period, during a process in which the sixth transistor T6 receives and transmits the high-level first voltage signal to the first node Q1, the second capacitor C2 is also charged. During a process in which the third transistor T3 transmits the low-level input signal to the second node Q2, the third capacitor C3 is also charged. In the S5 period, since the second capacitor C2 is discharged, the voltage of the first node Q1 remains the high level in the S4 period, which makes the fourth transistor T4 remain a turned-off state. As a result, there is no signal output by the first output sub-circuit 2. Since the third capacitor C3 is discharged, the voltage of the second node Q2 remains the low level in the S4 period, so that the fifth transistor T5 remains a turned-on state, thereby making the first output signal terminal Out1 output the first voltage signal provided by the first voltage signal terminal VGH.

Therefore, in the S5 period, the first output signal output by the first output signal terminal Out1 is equal to the first voltage signal.

In the S1 period, the level of the input signal provided by the input signal terminal Input is a high level, and the first transistor T1 is turned off under control of the input signal. The level of the first clock signal is a high level. Due to the action of the first capacitor C1, the voltage of the third node Q3 hops to a high level. The second transistor T2 may be turned off due to the action of the voltage of the third node Q3, so that there is no signal output by the first input sub-circuit 1.

The voltage of the first node Q1 remains the high level in the S5 period, and the fourth transistor T4 may be turned off due to the action of the voltage of the first node Q1, so that there is no signal output by the first output sub-circuit 2.

The level of the first clock signal is a high level, and the third transistor T3 may be turned off due to an action of the voltage of the first clock signal. Due to an action of the third capacitor C3, the voltage of the second node Q2 remains the low level in the S5 period. The fifth transistor T5 may be turned on due to an action of the voltage of the second node Q2, so that the first output signal terminal Out1 outputs the first voltage signal provided by the first voltage signal terminal VGH.

Therefore, in the S1 period, the first output signal output by the first output signal terminal Out1 is equal to the first voltage signal.

The shift register 100 has a simple structure, and is capable of accurately controlling the first output signal terminal Out1 to output the first output signal, which makes the production simple and the production cost low.

In some embodiments, as shown in FIGS. 9, 10, 13, 14, 19, and 21, the shift register 100 further includes a level reduction sub-circuit 6.

In some examples, as shown in FIGS. 9, 10, 13, 14, 19, and 21, the level reduction sub-circuit 6 is electrically connected to the second voltage signal terminal VGL and the first output signal terminal Out1. The level reduction sub-circuit 6 is configured to reduce the level of the first output signal output by the first output signal terminal Out1 in cooperation with the first output sub-circuit 2 to in a period when the first output sub-circuit 2 outputs the second voltage signal.

For example, in the period when the first output sub-circuit 2 outputs the second voltage signal, the level reduction sub-circuit 6 may be turned on due to an action of the second voltage signal, so as to transmit the second voltage signal received at the second voltage signal terminal VGL to the first output signal terminal Out1. As a result, the first output signal output by the first output signal terminal Out1 is a signal formed jointly by the second voltage signal output by the first output sub-circuit 2 and the second voltage signal output by the level reduction sub-circuit 6. Since the second voltage signal is a low-level signal, the level of the first output signal may decrease, and an output capability of the first output signal terminal Out1 may be improved.

A structure of the level reduction sub-circuit 6 is schematically described below.

In some examples, as shown in FIGS. 9, 10, 13, 14, 19 and 21, the level reduction sub-circuit 6 includes a seventh transistor T7.

Figure 10:
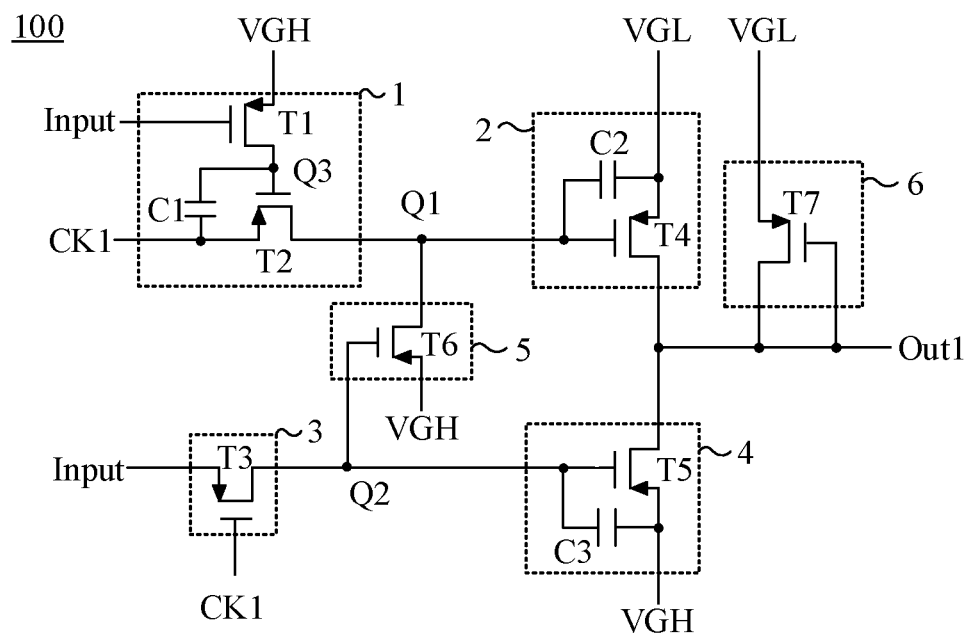
FIG. 10 is a circuit diagram of yet another shift register, in accordance with some embodiments of the present disclosure.
Figure 11:
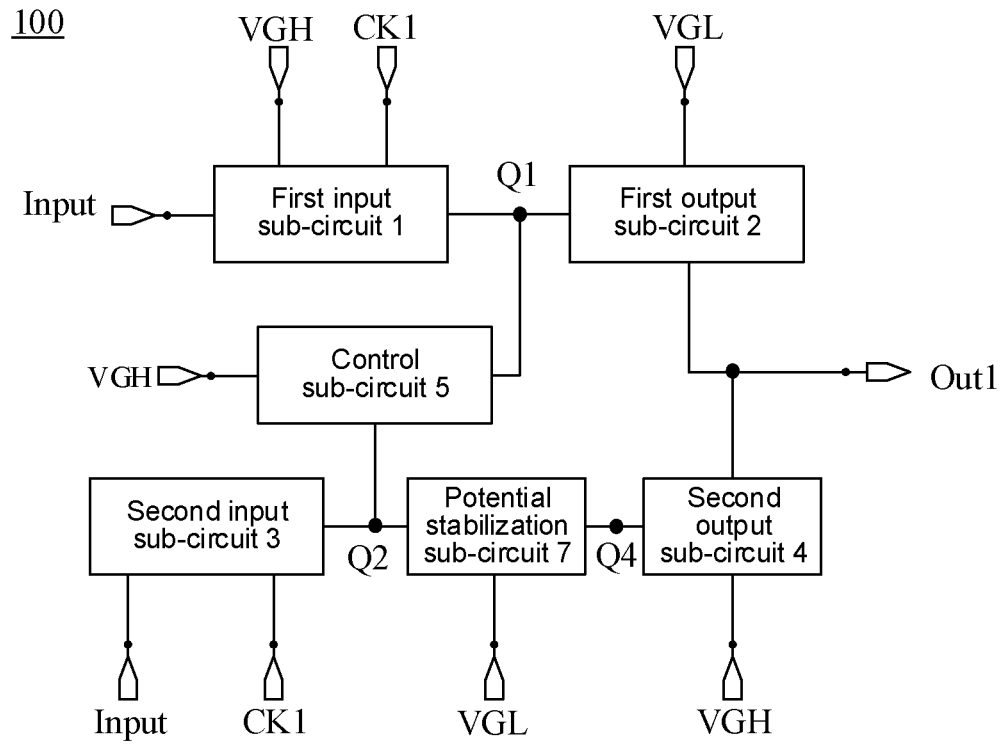
FIG. 11 is a structural diagram of yet another shift register, in accordance with some embodiments of the present disclosure.

For example, as shown in FIG. 10, a gate of the seventh transistor T7 is electrically connected to the first output signal terminal Out1, a second electrode of the seventh transistor T7 is electrically connected to the first output signal terminal Out1, and a first electrode of the seventh transistor T7 is electrically connected to the second voltage signal terminal VGL. The seventh transistor T7 is configured to be turned on under control of the second voltage signal, and transmit the second voltage signal received at the second voltage signal terminal VGL to the first output signal terminal Out1 in the period when the first output sub-circuit 2 outputs the second voltage signal, so that the first output signal terminal Out1 outputs the first output signal.

In a case where the first output sub-circuit 2 is turned on, the fourth transistor T4 may receive and transmit the second voltage signal to the first output signal terminal Out1, and the seventh transistor T7 may be turned on under control of the second voltage signal, so as to transmit the second voltage signal provided by the second voltage signal terminal VGL to the first output signal terminal Out1. In this case, the first output signal output by the first output signal terminal Out1 includes the second voltage signal output by the fourth transistor T4 and the second voltage signal output by the seventh transistor T7, so that the level of the first output signal output by the first output signal terminal Out1 may decrease, and the output capability of the first output signal terminal Out1 may be improved.

It will be noted that, for example, the level of the second voltage signal is a negative voltage, and in a case where the seventh transistor T7 transmits a second voltage signal with a negative level to the first output signal terminal Out1, the level of the first output signal is equal to the level of the second voltage signal. Therefore, the level of the first output signal decreases.

In some embodiments, as shown in FIGS. 11 to 14, 20 and 21, the shift register 100 further includes a potential stabilization sub-circuit 7.

In some examples, as shown in FIGS. 11 to 14, 20 and 21, the potential stabilization sub-circuit 7 is electrically connected to the second voltage signal terminal VGL, the second node Q2, and a fourth node Q4. The potential stabilization sub-circuit 7 is configured to transmit the voltage of the second node Q2 to the fourth node Q4 in response to the second voltage signal, and stabilize the voltage of the fourth node Q4. The second output sub-circuit 4 is electrically connected to the fourth node Q4, and is electrically connected to the second node Q2 through the potential stabilization sub-circuit 7. That is, the second output sub-circuit 4 is electrically connected to the second input sub-circuit 3 indirectly, and the second output sub-circuit 4 is electrically connected to the second input sub-circuit 3 through the potential stabilization sub-circuit 7.

For example, the second voltage signal is a low-level signal, and the potential stabilization sub-circuit 7 may be turned on under control of the second voltage signal, so as to transmit the input signal from the second node Q2 transmitted by the second input sub-circuit 3 to the fourth node Q4. In a case where the level of the input signal transmitted to the fourth node Q4 is a low level, the second output sub-circuit 4 may be turned on under control of the voltage of the fourth node Q4, so as to output the first output signal.

In a case where the second input sub-circuit 3 is turned off, there is no signal output by the second input sub-circuit 3, and the second node Q2 is in a floating state. By arranging the potential stabilization sub-circuit 7, the voltage of the second node Q2 may be controllable, and the voltage of the fourth node Q4 may be stable.

A structure of the potential stabilization sub-circuit 7 is schematically described below.

In some examples, as shown in FIGS. 12, 14, 20, and 21, the potential stabilization sub-circuit 7 includes an eighth transistor T8.

Figure 12:
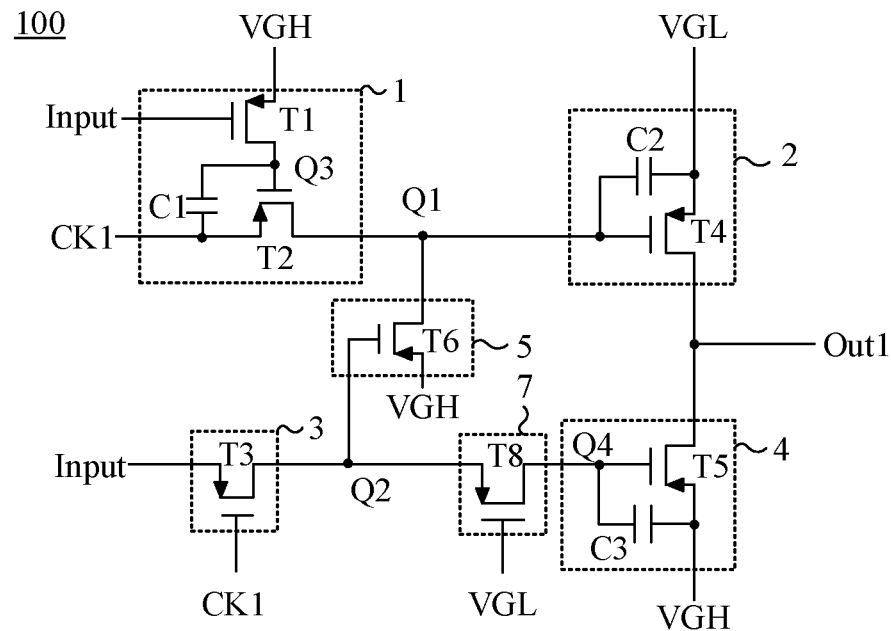
FIG. 12 is a circuit diagram of yet another shift register, in accordance with some embodiments of the present disclosure.
Figure 13:
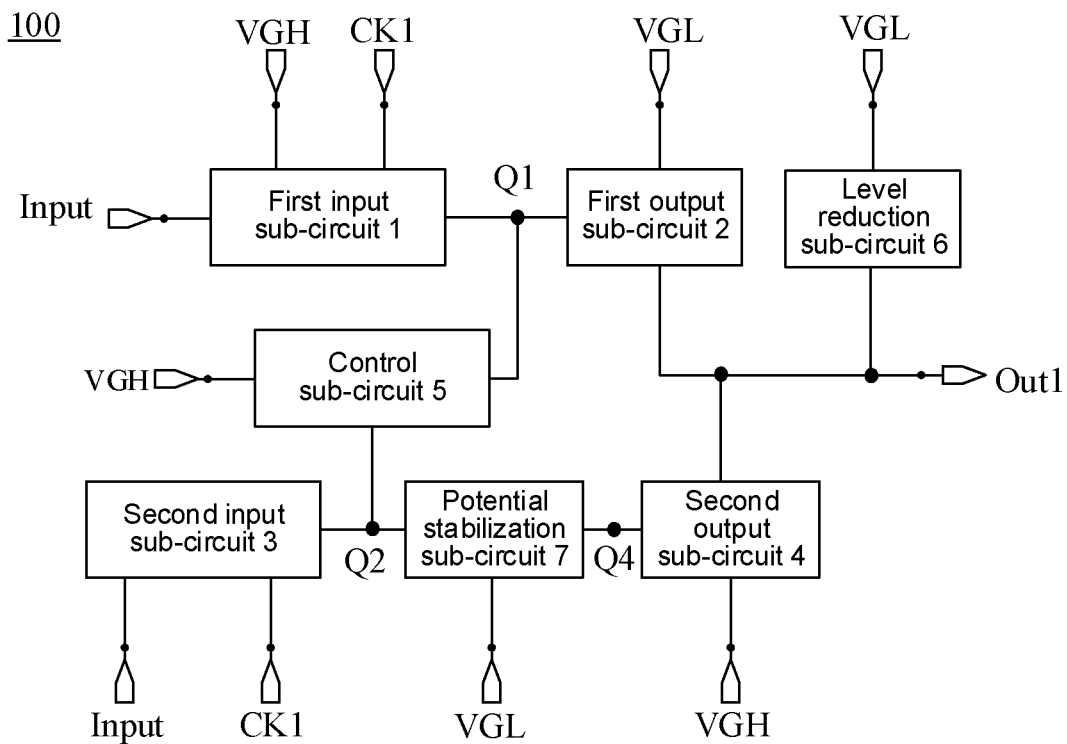
FIG. 13 is a structural diagram of yet another shift register, in accordance with some embodiments of the present disclosure.
Figure 14:
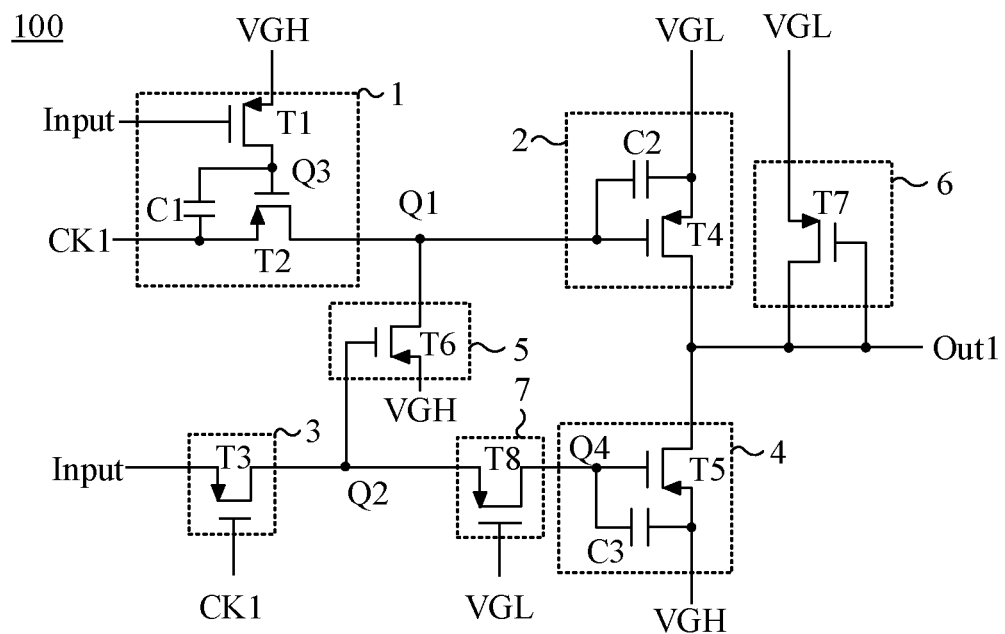
FIG. 14 is a circuit diagram of yet another shift register, in accordance with some embodiments of the present disclosure.
Figure 15:
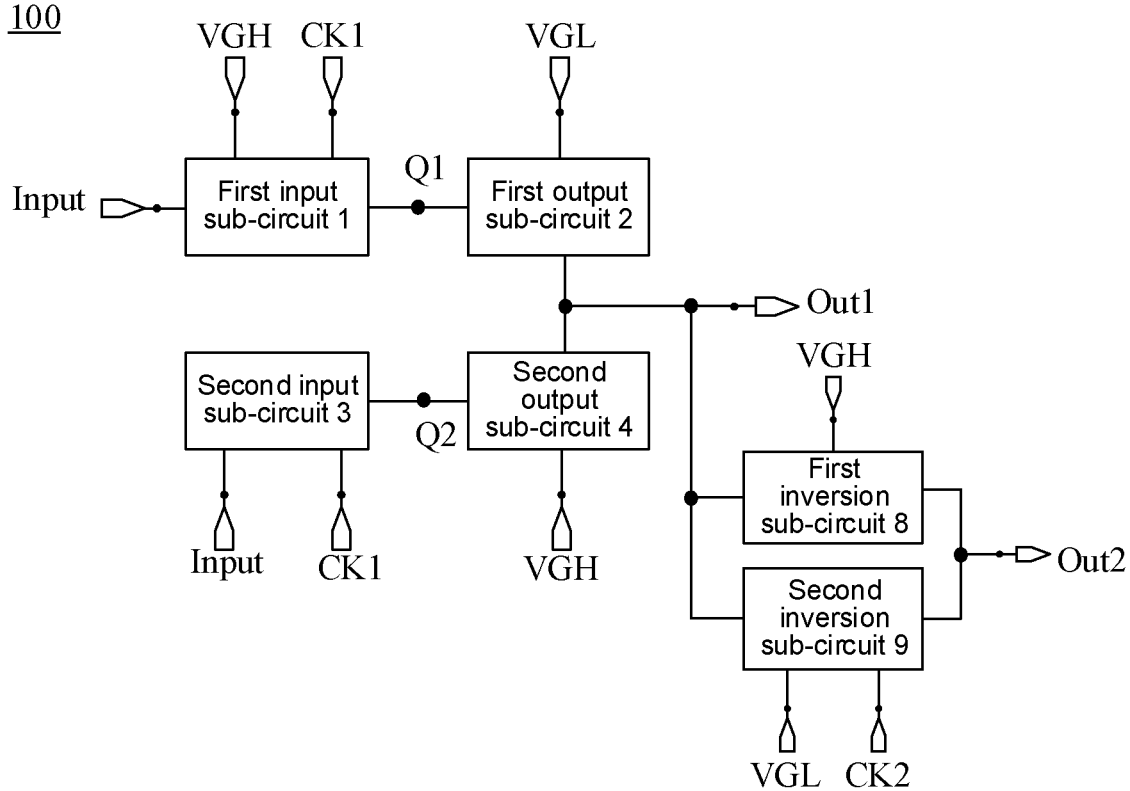
FIG. 15 is a structural diagram of yet another shift register, in accordance with some embodiments of the present disclosure.

For example, as shown in FIG. 12, a gate of the eighth transistor T8 is electrically connected to the second voltage signal terminal VGL, a first electrode of the eighth transistor T8 is electrically connected to the second node Q2, and a second electrode of the eighth transistor T8 is electrically connected to the fourth node Q4.

Since the gate of the eighth transistor T8 is electrically connected to the second voltage signal terminal VGL, and the second voltage signal is a low-level signal, the eighth transistor T8 is in a normally-on state.

In a case where the third transistor T3 in the second input sub-circuit 3 is turned on, the third transistor T3 may receive and transmit the input signal to the second node. The input signal may be transmitted to the fourth node Q4 through the eighth transistor T8, so as to control a turned-on state of the second output sub-circuit.

In a case where the third transistor T3 is turned off, there is no signal output by the third transistor T3. The eighth transistor T8 may make the voltage of the second node Q2 controllable, so as to avoid affecting a turned-on state of the sixth transistor T6 in the control sub-circuit 5. Moreover, the eighth transistor T8 may also make a potential of the fourth node Q4 stable, and ensure a stable operation performance of the fifth transistor T5.

In some embodiments, as shown in FIGS. 15 to 21, the shift register 100 further includes a first inversion sub-circuit 8 and a second inversion sub-circuit 9.

In some examples, as shown in FIGS. 15 to 21, the first inversion sub-circuit 8 is electrically connected to the first output signal terminal Out1, the first voltage signal terminal VGH, and a second output signal terminal Out2. The first voltage signal terminal VGH is further used for transmitting the first voltage signal to the first inversion sub-circuit 8. The first inversion sub-circuit 8 is configured to transmit the first voltage signal received at the first voltage signal terminal VGH to the second output signal terminal Out2 in response to the first output signal received at the first output signal terminal Out1.

For example, in a case where the level of the first output signal is a level required for the first inversion sub-circuit 8 to be turned on, the first inversion sub-circuit 8 may be turned on under control of the first output signal, so as to receive and transmit the first voltage signal to the second output signal terminal Out2.

During a period when the first inversion sub-circuit 8 is turned on, the second output signal terminal Out2 outputs the first voltage signal as a second output signal.

In some examples, as shown in FIGS. 15 to 21, the second inversion sub-circuit 9 is electrically connected to the first output signal terminal Out1, the second voltage signal terminal VGL, a second clock signal terminal CK2, and the second output signal terminal Out2. The second voltage signal terminal VGL is further used for transmitting the second voltage signal to the second inversion sub-circuit 9. The second clock signal terminal CK2 is used for receiving a second clock signal and transmitting the second clock signal to the second inversion sub-circuit 9. The second inversion sub-circuit 9 is configured to transmit the second voltage signal received at the second voltage signal terminal VGL to the second output signal terminal Out2 in response to the first output signal received at the first output signal terminal Out1 and the second clock signal received at the second clock signal terminal CK2.

For example, the second inversion sub-circuit 9 may be turned on due to an action of the first output signal and the second clock signal, so as to receive and transmit the second voltage signal to the second output signal terminal Out2.

During a period when the second inversion sub-circuit 9 is turned on, the second output signal terminal Out2 outputs the second voltage signal as the second output signal.

It will be noted that, the first inversion sub-circuit 8 and the second inversion sub-circuit 9 may be turned on in different periods through a cooperation of the first output signal and the second clock signal. In this way, during a process in which the first inversion sub-circuit 8 outputs the second output signal, the second output signal only includes the first voltage signal, and during a process in which the second inversion sub-circuit 9 outputs the second output signal, the second output signal only includes the second voltage signal, which is beneficial to ensure an accuracy and stability of the second output signal.

In some examples, in a case where a plurality of shift registers 100 are cascaded to form the gate driver circuit 1000, except for the last stage of the shift register 100, each stage of shift register 100 may include the first inversion sub-circuit 8 and the second inversion sub-circuit 9, so as to convert the first output signal into the second output signal. A second output signal terminal Out2 of the stage of shift register 100 may be electrically connected to an input signal terminal Input of the next stage of the shift register 100, so that a second output signal output by the second output signal terminal Out2 of the stage of the shift register 100 is served as an input signal of the next stage of the shift register 100. As a result, the plurality of shift registers 100 are cascaded, so as to complete scan of the sub-pixels P of the display panel PNL row by row.

Structures of the first inversion sub-circuit 8 and the second inversion sub-circuit 9 are schematically described below.

In some examples, as shown in FIGS. 16 and 18 to 21, the first inversion sub-circuit 8 includes a ninth transistor T9.

Figure 16:
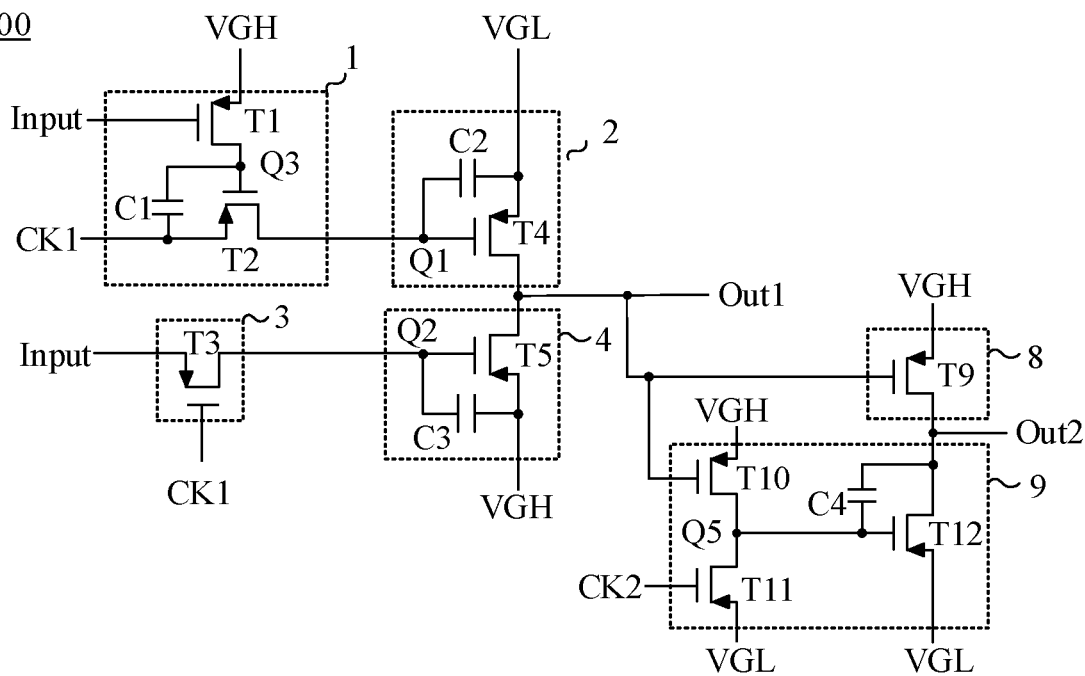
FIG. 16 is a circuit diagram of yet another shift register, in accordance with some embodiments of the present disclosure.
Figure 17:
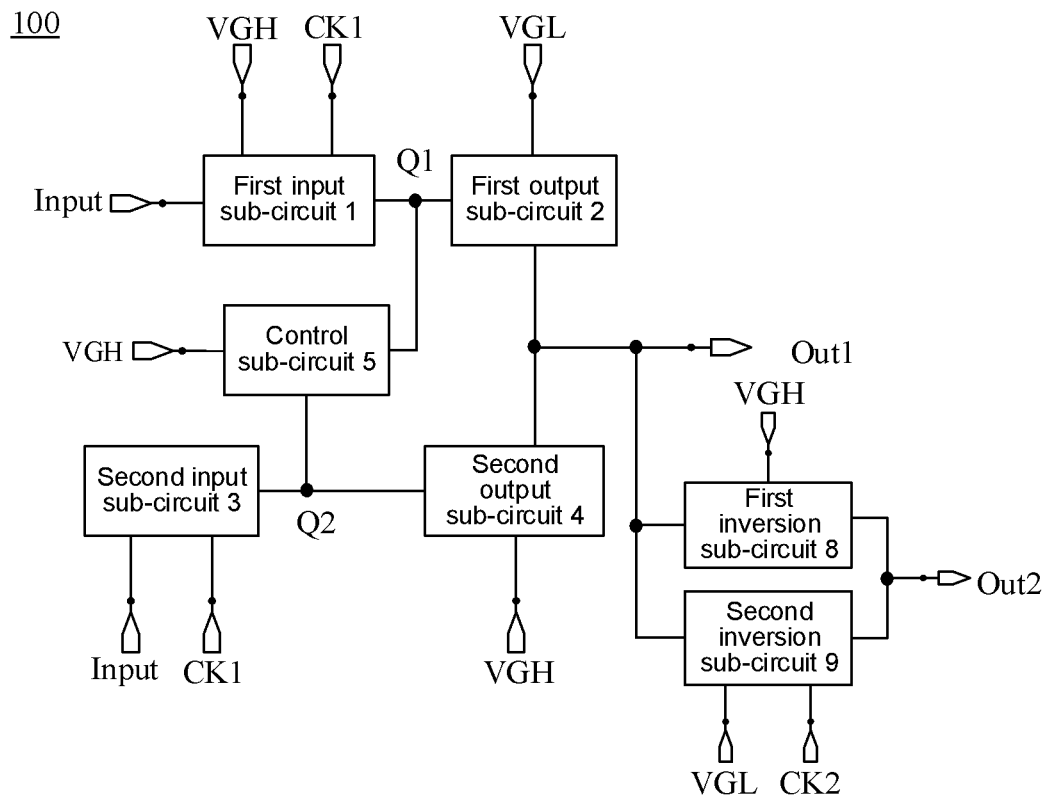
FIG. 17 is a structural diagram of yet another shift register, in accordance with some embodiments of the present disclosure.
Figure 18:
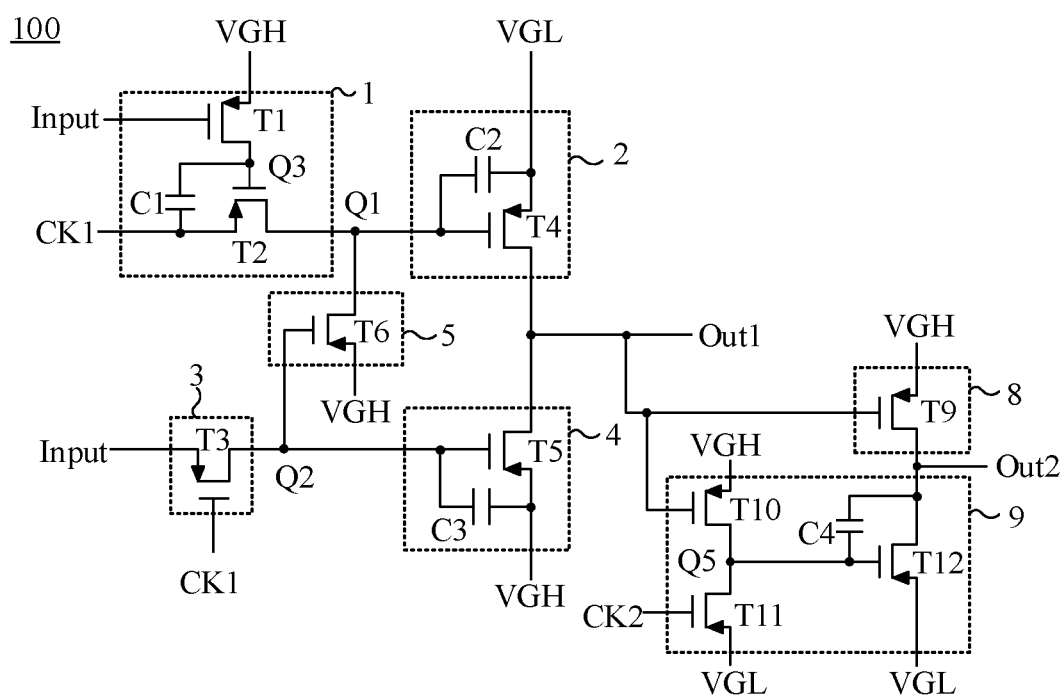
FIG. 18 is a circuit diagram of yet another shift register, in accordance with some embodiments of the present disclosure.
Figure 19:
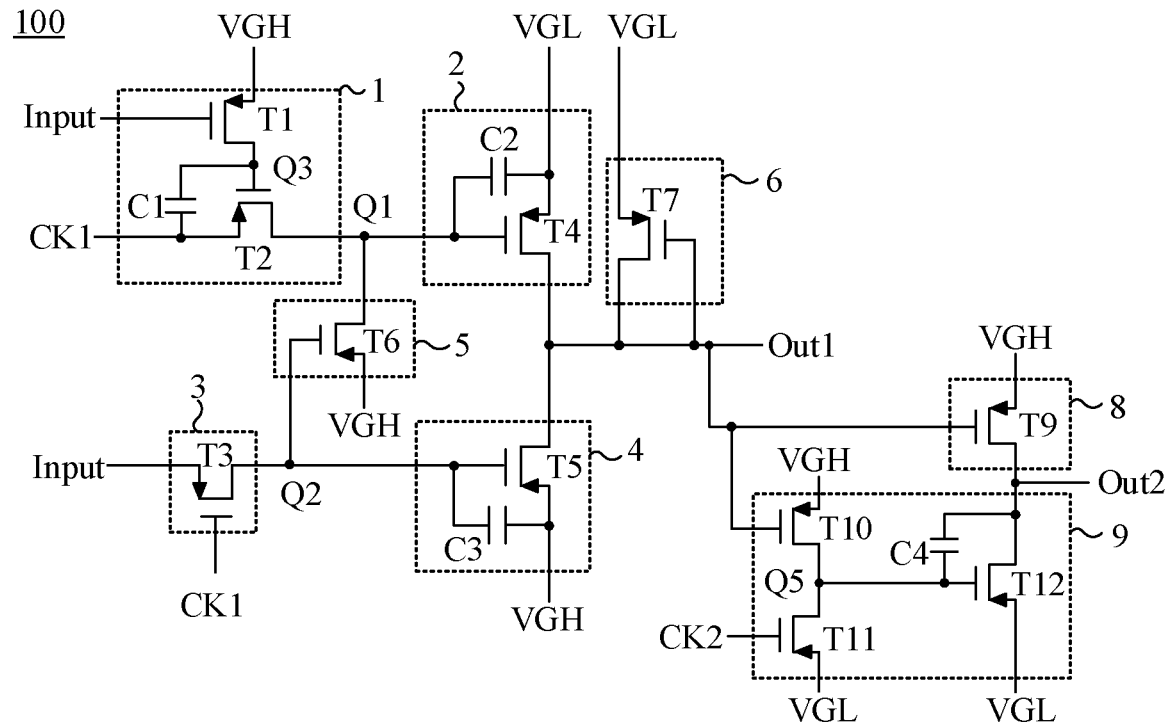
FIG. 19 is a circuit diagram of yet another shift register, in accordance with some embodiments of the present disclosure.
Figure 20:
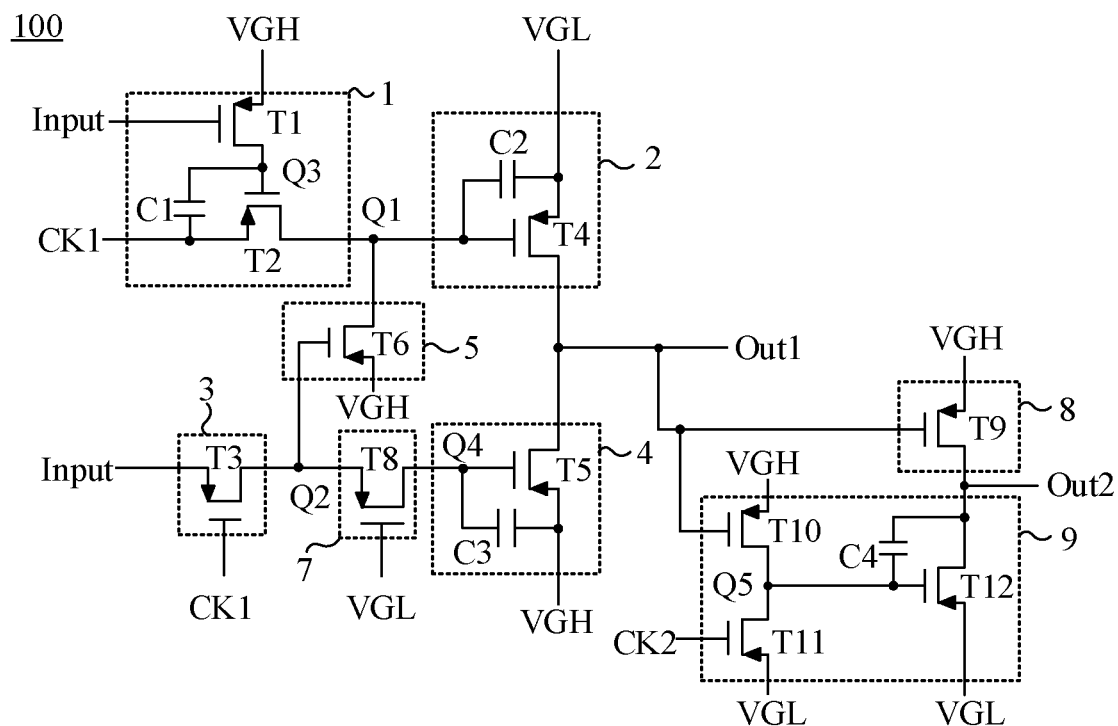
FIG. 20 is a circuit diagram of yet another shift register, in accordance with some embodiments of the present disclosure.
Figure 21:
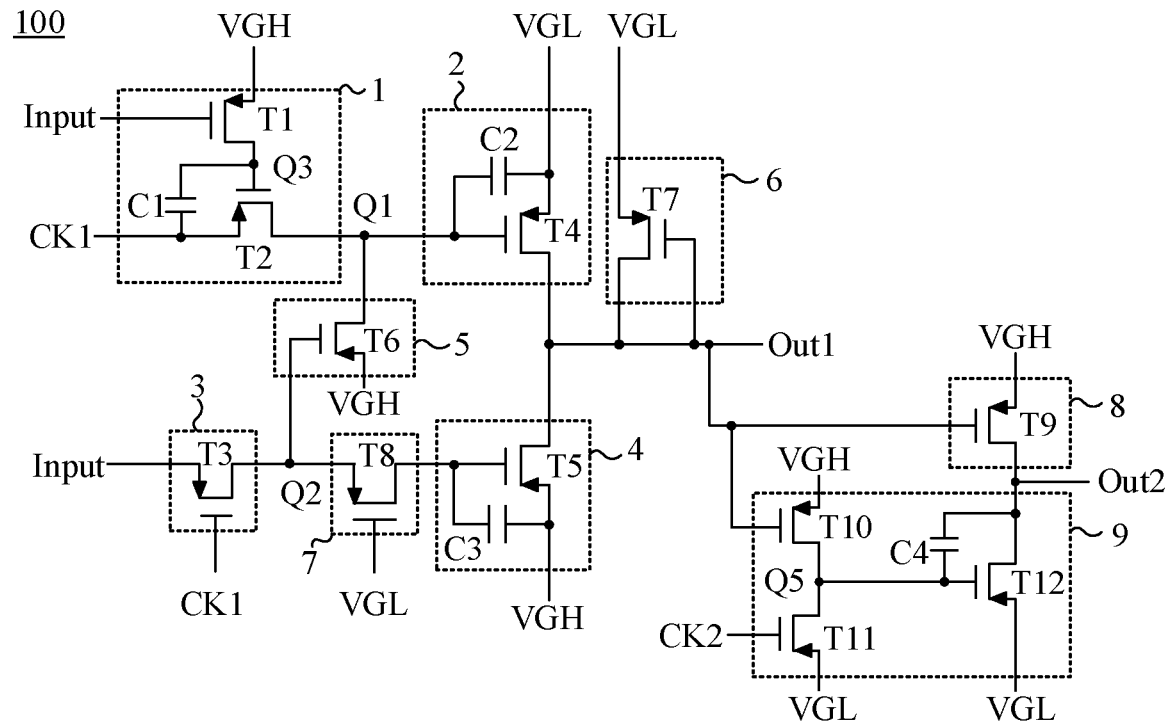
FIG. 21 is a circuit diagram of yet another shift register, in accordance with some embodiments of the present disclosure.

For example, as shown in FIG. 16, a gate of the ninth transistor T9 is electrically connected to the first output signal terminal Out1, a first electrode of the ninth transistor T9 is electrically connected to the first voltage signal terminal VGH, and a second electrode of the ninth transistor T9 is electrically connected to the second output signal terminal Out2. The ninth transistor T9 is configured to transmit the first voltage signal to the second output signal terminal Out2 under control of the first output signal.

For example, in a case where the level of the first output signal is a low level, the ninth transistor T9 may be turned on due to an action of the first output signal to receive and transmit the first voltage signal to the second output signal terminal Out2, so that the second output signal terminal Out2 outputs the first voltage signal as the second output signal.

In this case, the low-level first output signal is, for example, the second voltage signal output by the first output sub-circuit 2.

In some examples, as shown in FIGS. 16 and 18 to 21, the second inversion sub-circuit 9 is further electrically connected to the first voltage signal terminal VGH, and the second inversion sub-circuit 9 includes a tenth transistor T10, an eleventh transistor T11, a twelfth transistor T12, and a fourth capacitor C4.

For example, as shown in FIG. 16, a gate of the tenth transistor T10 is electrically connected to the first output signal terminal Out1, a first electrode of the tenth transistor T10 is electrically connected to the first voltage signal terminal VGH, and a second electrode of the tenth transistor T10 is electrically connected to a fifth node Q5. The tenth transistor T10 is configured to transmit the first voltage signal to the fifth node Q5 under control of the first output signal.

For example, in the case where the level of the first output signal is a low level, the tenth transistor T10 may be turned on due to the action of the first output signal to receive and transmit the first voltage signal to the fifth node Q5, so that a voltage of the fifth node Q5 increases.

For example, as shown in FIG. 16, a gate of the eleventh transistor T11 is electrically connected to the second clock signal terminal CK2, a first electrode of the eleventh transistor T11 is electrically connected to the second voltage signal terminal VGL, and a second electrode of the eleventh transistor T11 is electrically connected to the fifth node Q5. The eleventh transistor T11 is configured to transmit the second voltage signal to the fifth node Q5 under control of the second clock signal.

For example, in a case where a level of the second clock signal is a low level, the eleventh transistor T11 may be turned on due to an action of the second clock signal to receive and transmit the second voltage signal to the fifth node Q5, so that the voltage of the fifth node Q5 decreases.

For example, as shown in FIG. 16, a gate of the twelfth transistor T12 is electrically connected to the fifth node Q5, a first electrode of the twelfth transistor T12 is electrically connected to the second voltage signal terminal VGL, and a second electrode of the twelfth transistor T12 is electrically connected to the second output signal terminal Out2. The twelfth transistor T12 is configured to transmit the second voltage signal received at the second voltage signal terminal VGL to the second output signal terminal Out2 under control of the voltage of the fifth node Q5.

For example, in a case where the voltage of the fifth node Q5 is a low level, the twelfth transistor T12 may be turned on under control of the voltage of the fifth node Q5 to receive and transmit the second voltage signal to the second output signal terminal Out2, so that the second output signal terminal Out2 outputs the second voltage signal as the second output signal.

For example, as shown in FIG. 16, a first terminal of the fourth capacitor C4 is electrically connected to the fifth node Q5, and a second terminal of the fourth capacitor C4 is electrically connected to the second output signal terminal Out2. The fourth capacitor C4 is configured to maintain a potential of the fifth node Q5.

For example, in a case where the tenth transistor T10 is turned on and transmits the first voltage signal to the fifth node Q5, the fourth capacitor C4 is also charged. In this way, in a case where the tenth transistor T10 is turned off, the fourth capacitor C4 may also be discharged, so that the potential of the fifth node Q5 maintains a high level.

In a case where the eleventh transistor M11 is turned on and transmits the second voltage signal to the fifth node Q5, the fourth capacitor C4 is also charged. In this way, in a case where the tenth transistor T10 is turned off, the fourth capacitor C4 may also be discharged, so that the potential of the fifth node Q5 maintains a low level.

Operating processes of the first inversion sub-circuit 8 and the second inversion sub-circuit 9 is schematically described below with reference to FIGS. 16 and 22.

In the S2 period, as shown in FIGS. 16 and 22, the level of the first output signal output by the first output signal terminal Out1 is a low level, and the ninth transistor T9 in the first inversion sub-circuit 8 may be turned on under control of the first output signal to transmit the first voltage signal received at the first voltage signal terminal VGH to the second output signal terminal Out2, so that the second output signal output by the second output signal terminal Out2 is equal to the first voltage signal.

The level of the first output signal output by the first output signal terminal Out1 is the low level. In the second inversion sub-circuit 9, the tenth transistor T10 may be turned on under control of the first output signal to transmit the first voltage signal received at the first voltage signal terminal VGH to the fifth node Q5, so that the voltage of the fifth node Q5 increases. The twelfth transistor T12 may be turned off under control of the voltage of the fifth node Q5. The level of the second clock signal is a high level, and the eleventh transistor T11 may be turned off under control of the second clock signal. There is no signal output by the second inversion sub-circuit 9.

Therefore, in the S2 period, the second output signal output by the second output signal terminal Out2 is equal to the first voltage signal.

In the S3 period, the level of the first output signal output by the first output signal terminal Out1 is still the low level, and the level of the second clock signal is still the high level. The operating processes of the first inversion sub-circuit 8 and the second inversion sub-circuit 9 are the same as that in the S2 period, and details may be referred to the description in the S2, which will not be repeated here.

Therefore, in the S3 period, the second output signal output by the second output signal terminal Out2 is equal to the first voltage signal.

In the S4 period, the level of the first output signal output by the first output signal terminal Out1 changes to a high level, the ninth transistor T9 may be turned off under control of the first output signal, and there is no signal output by the first inversion sub-circuit 8.

The tenth transistor T10 may also be turned off under control of the first output signal.

The level of the second clock signal changes to a low level, and the eleventh transistor T11 may be turned on under control of the second clock signal to transmit the second voltage signal received at the second voltage signal terminal VGL to the fifth node Q5, so that the voltage of the fifth node Q5 decreases. The twelfth transistor T12 may be turned on under control of the voltage of the fifth node Q5, so as to transmit the second voltage signal received at the second voltage signal terminal VGL to the second output signal terminal Out2.

Therefore, in the S4 period, the second output signal output by the second output signal terminal Out2 is equal to the second voltage signal.

In the S5 period, the level of the first output signal output by the first output signal terminal Out1 is still the high level, and the level of the second clock signal is still the low level. The operating processes of the first inversion sub-circuit 8 and the second inversion sub-circuit 9 are the same as that in the S4 period, and details may be referred to the description in the S4, which will not be repeated here.

Therefore, in the S5 period, the second output signal output by the second output signal terminal Out2 is equal to the second voltage signal.

In the S1 period, the level of the first output signal output by the first output signal terminal Out1 is still the high level, and the level of the second clock signal is still the low level. The operating processes of the first inversion sub-circuit 8 and the second inversion sub-circuit 9 are the same as that in the S4 period, and details may be referred to the description in the S4, which will not be repeated here.

Therefore, in the S1 period, the second output signal output by the second output signal terminal Out2 is equal to the second voltage signal.

Figure 23:
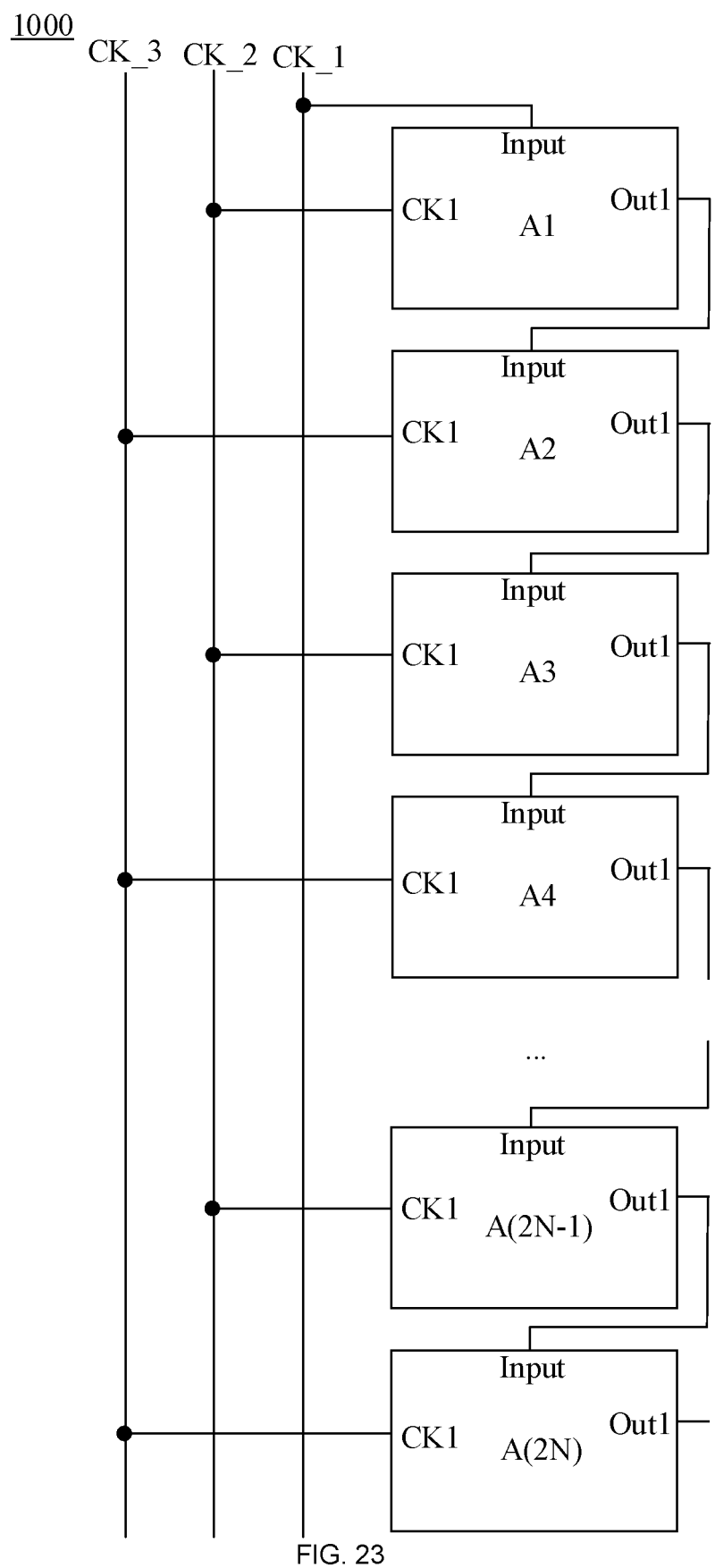
FIG. 23 is a structural diagram of a gate driver circuit, in accordance with some embodiments of the present disclosure.
Figure 24:
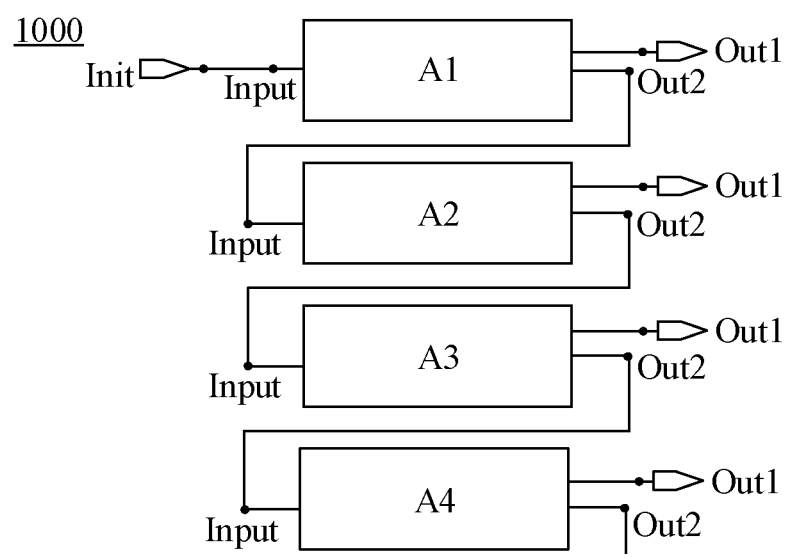
FIG. 24 is a structural diagram of another gate driver circuit, in accordance with some embodiments of the present disclosure.
Figure 25:
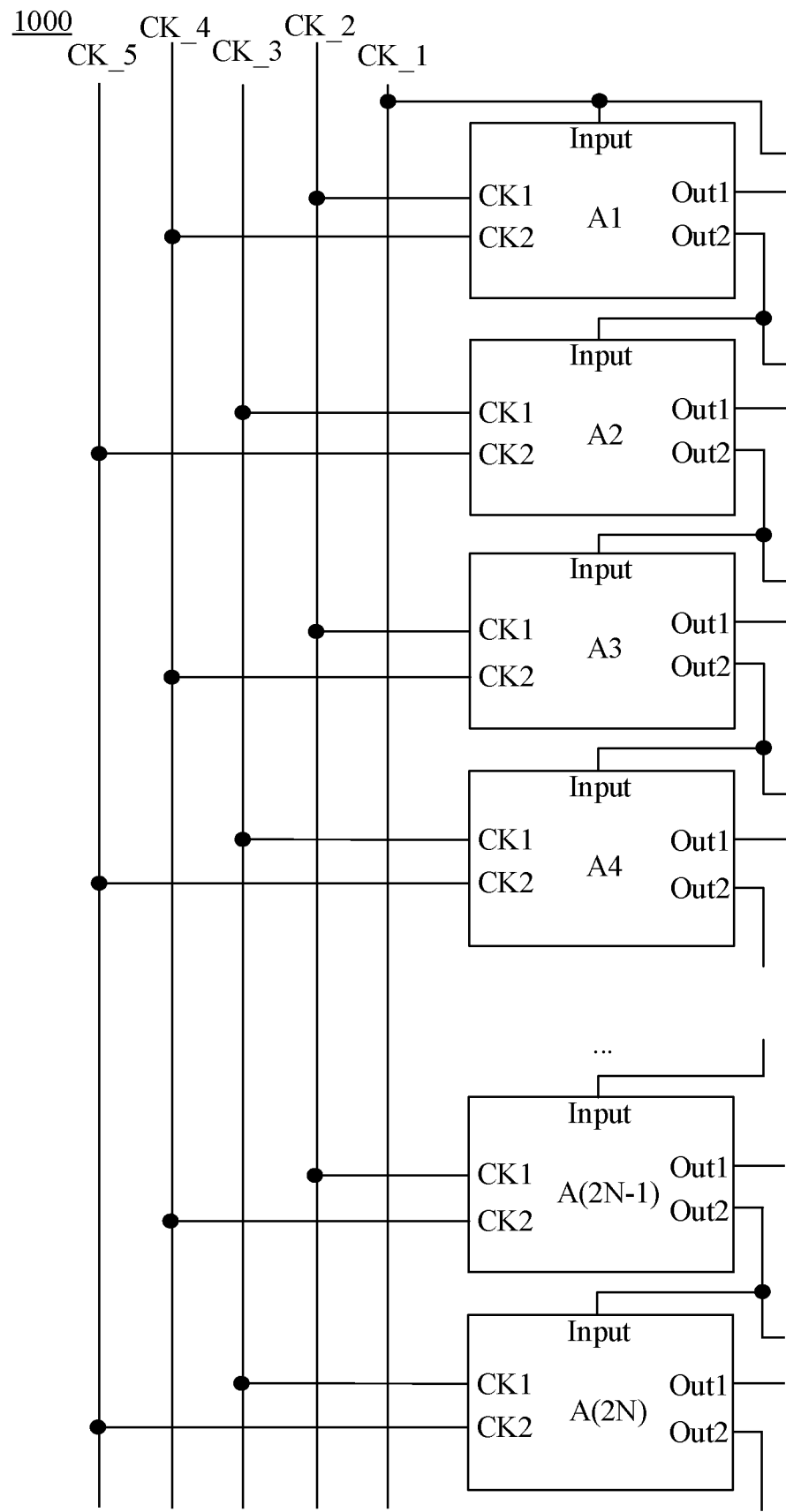
FIG. 25 is a structural diagram of yet another gate driver circuit, in accordance with some embodiments of the present disclosure.

In some embodiments of the present disclosure, a gate driver circuit 1000 is also provided as shown in FIGS. 23 to 25. The gate driver circuit 1000 includes the plurality of shift registers 100 that are cascaded as described above.

A1, A2, A3, and A4 shown in FIGS. 23 to 25 represent the shift registers 100. The shift registers 100 may be electrically connected to corresponding rows of sub-pixels P in the display panel PNL, and provide required scan signals to the corresponding rows of sub-pixels P, so as to scan the sub-pixels row by row.

The gate driver circuit 1000 may be of a variety of structures, which may be selected and set according to actual needs.

In some examples, each shift register 100 includes the first input sub-circuit 1, the first output sub-circuit 2, the second input sub-circuit 3, and the second output sub-circuit 4. As shown in FIG. 23, signal lines in the gate driver circuit 1000 are schematically illustrated by taking the structure diagram of the gate driver circuit 1000 shown in FIG. 23 as an example.

As shown in FIG. 23, the gate driver circuit 1000 includes a first sub-clock signal line CK_1, a second sub-clock signal line CK_2, and a third sub-clock signal line CK_3.

As shown in FIG. 23, an input signal terminal Input of the first stage of shift register 100 may be electrically connected to the first sub-clock signal line CK_1 to receive an initial signal as an input signal (in this case, the input signal terminal Input is electrically connected to the first sub-clock signal line CK_1 through an initial signal terminal Init). For the other stages of shift registers, an input signal terminal Input of a certain stage of shift register 100 may be, for example, electrically connected (e.g., electrically connected indirectly) to a first output signal terminal Out1 of the previous stage of shift register 100. Before the stage of shift register 100 receives a first output signal output by the first output signal terminal Out1 of the previous stage of shift register 100, for example, the first output signal may be inverted, so that the inverted first output signal may be served as an input signal of the stage of shift register 100.

As shown in FIG. 23, a first clock signal terminal CK1 of the (2N−1)th stage of shift register 100 may be electrically connected to the second sub-clock signal line CK_2 to receive the first clock signal. N is a positive integer. That is, odd stages of shift registers 100 may be electrically connected to a same second sub-clock signal line CK_2 to receive the first clock signal.

As shown in FIG. 23, a first clock signal terminal CK1 of the (2N)th stage of shift register 100 may be electrically connected to the third sub-clock signal line CK_3 to receive the first clock signal. That is, even stages of shift registers 100 may be electrically connected to a same third sub-clock signal line CK_3 to receive the first clock signal.

Here, a waveform of the first clock signal transmitted by the second sub-clock signal line CK_2 may be as shown in FIG. 22. A phase of the first clock signal transmitted by the third sub-clock signal line CK_3 differs from a phase of the first clock signal transmitted by the second sub-clock signal line CK_2 by 1H (e.g., 1H lags).

In addition, the gate driver circuit 1000 may further include a first DC voltage signal line and a second DC voltage signal line.

First voltage signal terminals VGH of stages of shift registers 100 may be electrically connected to the first DC voltage signal line to receive the first voltage signal. Second voltage signal terminals VGL of stages of shift registers 100 may be electrically connected to the second DC voltage signal line to receive the second voltage signal.

In some other examples, each shift register 100 includes the first input sub-circuit 1, the first output sub-circuit 2, the second input sub-circuit 3, the second output sub-circuit 4, the first inversion sub-circuit 8 and the second inversion sub-circuit 9. As shown in FIGS. 24 and 25, signal lines in the gate driver circuit 1000 are schematically illustrated by taking the structure diagram of the gate driver circuit 1000 shown in FIG. 25 as an example.

As shown in FIG. 25, the gate driver circuit 1000 includes a first sub-clock signal line CK_1, a second sub-clock signal line CK_2, a third sub-clock signal line CK_3, a fourth sub-clock signal line CK_4 and a fifth sub-clock signal line CK_5.

As shown in FIG. 25, the input signal terminal Input of the first stage of shift register 100 may be electrically connected to the first sub-clock signal line CK_1 to receive an initial signal as an input signal. In this case, the input signal terminal Input is electrically connected to the first sub-clock signal line CK_1 through an initial signal terminal Init, and the initial signal terminal Init may transmit the initial signal. Except for the first stage of shift register 100, for the other stages of shift registers, an input signal terminal Input of a certain stage of shift register 100 is electrically connected to a second output signal terminal Out2 of the previous stage of shift register 100. A second output signal output by the second output signal terminal Out2 of the previous stage of shift register 100 is served as the input signal of the stage of shift register 100.

For the last stage of shift register 100, the second output signal terminal Out2 may be set, or the second output signal terminal Out2 may not be set. In a case where the second output signal terminal Out2 is set for the last stage of shift register 100, the second output signal terminal Out2 may be free.

As shown in FIG. 25, the first clock signal terminal CK1 of the (2N−1)th stage of shift register may be electrically connected to the second sub-clock signal line CK_2 to receive the first clock signal. A second clock signal terminal CK2 of the (2N−1)th stage of shift register may be electrically connected to the fourth sub-clock signal line CK_4 to receive the second clock signal. That is, the odd stages of shift registers 100 may be electrically connected to a same fourth sub-clock signal line CK_4 to receive the second clock signal.

As shown in FIG. 25, the first clock signal terminal CK1 of the (2N)th stage of shift register may be electrically connected to the third sub-clock signal line CK_3 to receive the first clock signal. A second clock signal terminal CK2 of the (2N)th stage of shift register may be electrically connected to the fifth sub-clock signal line CK_5 to receive the second clock signal. That is, the even stages of shift registers 100 may be electrically connected to a same fifth sub-clock signal line CK_5 to receive the second clock signal.

Here, a waveform of the second clock signal transmitted by the fourth sub-clock signal line CK_4 may be as shown in FIG. 22. A phase of the second clock signal transmitted by the fifth sub-clock signal line CK_5 differs from a phase of the second clock signal transmitted by the fourth sub-clock signal line CK_4 by 2H (e.g., 2H lags).

In addition, the gate driver circuit 1000 may further include a first DC voltage signal line and a second DC voltage signal line.

First voltage signal terminals VGH of stages of shift registers 100 may be electrically connected to the first DC voltage signal line to receive first voltage signal. Second voltage signal terminals VGL of stages of shift registers 100 may be electrically connected to the second DC voltage signal line to receive second voltage signal.

Of course, the examples are only two examples of signal lines included in the gate driver circuit 100. The type and the number of signal lines included in the gate driver circuit 1000 are not limited to the two examples. Electrical connection manners between the signal lines and the shift registers 100 in the gate driver circuit 1000 are not limited to the two examples.

The gate driver circuit 1000 provided by some embodiments of the present disclosure has the same beneficial effects as the shift register 100, which will not be repeated.

In some embodiments of the present disclosure, a driving method of the shift register is also provided. The driving method, within one image frame, of the shift register 100 in the present disclosure is schematically described by taking the first stage of shift register 100 in the gate driver circuit 1000 (which is formed by cascading the shift registers 100 shown in FIG. 6 or FIG. 8) shown in FIG. 23 as an example and with reference to the timing diagram shown in FIG. 22.

In some examples, the driving method of the first stage of shift register 100 within one image frame includes the following.

A first period (which is also referred to as a first output period):

in the first output period, transmitting, by the first output sub-circuit 2, the second voltage signal received at the second voltage signal terminal VGL to the first output signal terminal Out1 when the first output sub-circuit 2 is turned on under control of the voltage of the first node Q1, so that the first output signal terminal Out1 outputs the second voltage signal as the first output signal; and turning off the second output sub-circuit 4 under control of the voltage of the second node Q2, so that there is no signal output by the second output sub-circuit 4.

The first output period includes the S2 period and the S3 period. In the first output period, the operating processes of the transistors and the capacitors in the shift register 100 may be referred to the description in the S2 period and the S3 period in some of the examples, which will not be repeated here.

A second period (which is also referred to as a second output period):

in the second period, turning off the first output sub-circuit 2 under control of the voltage of the first node Q1; and transmitting, by the second output sub-circuit 4, the first voltage signal received at the first voltage signal terminal VGH to the first output signal terminal Out1 when the second output sub-circuit 4 is turned on under control of the voltage of the second node Q2, so that the first output signal terminal Out1 outputs the first voltage signal as the first output signal.

The second output period includes the S4 period, the S5 period and the S1 period. In the second output period, the operating processes of the transistors and the capacitors in the shift register 100 may be referred to the description in the S4 period, the S5 period and the S1 period in some of the examples, which will not be repeated here.

In some embodiments, in the display apparatus 2000 provided by the present disclosure, a connection relationship between the stages of shift registers 100 in the gate driver circuit 1000 and the pixel driving circuits 200 in the sub-pixels P may be selected and set according to actual needs.

In some examples, as shown in FIG. 2, the sub-pixels P may be arranged in rows in the first direction X. A row of sub-pixels P includes at least two sub-pixels P. Correspondingly, the pixel driving circuits 200 included in the sub-pixels P may be arranged in the rows in the first direction X, and a row of pixel driving circuits 200 may include at least two pixel driving circuits 200.

Figure 26:
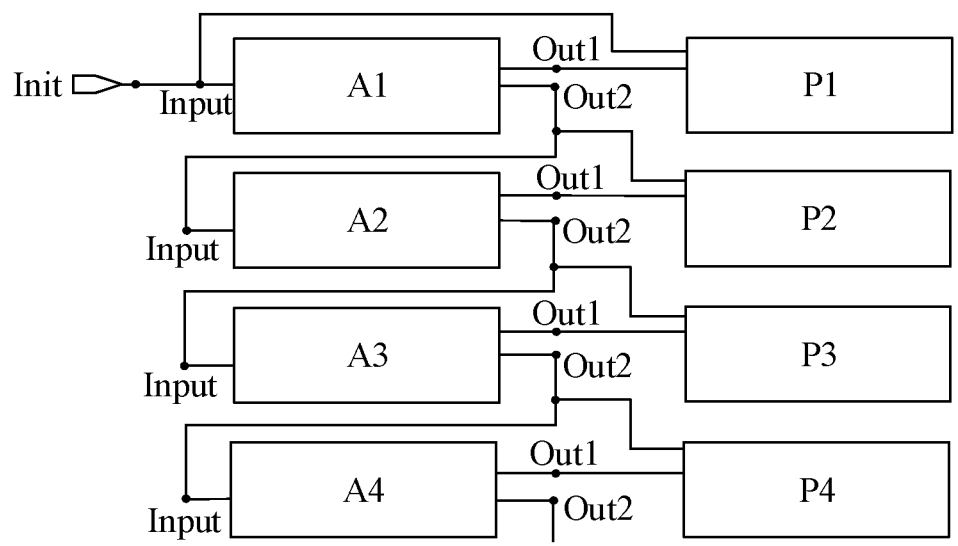
FIG. 26 is a structural diagram of a gate driver circuit electrically connected to sub-pixels, in accordance with some embodiments of the present disclosure.
Figure 27:
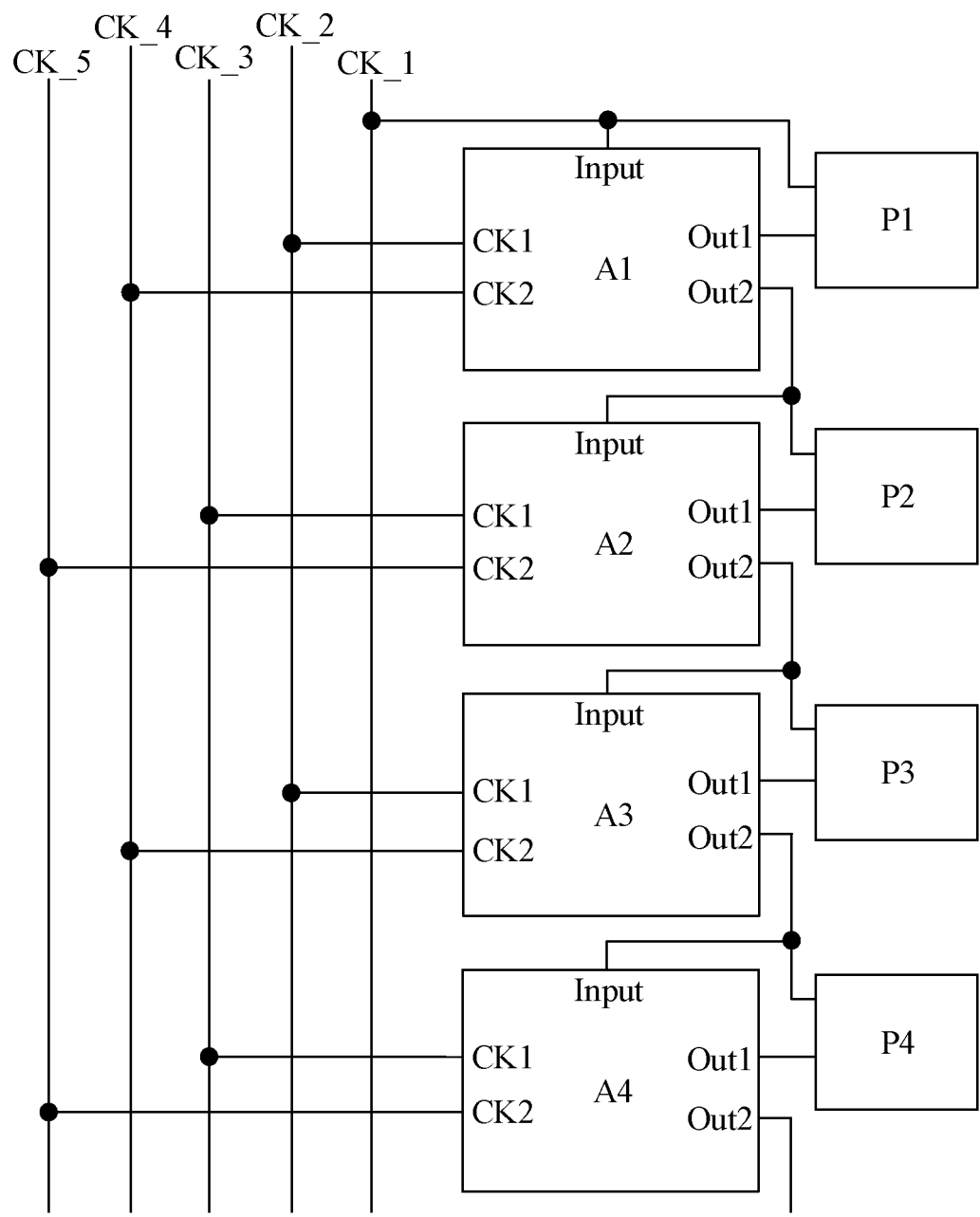
FIG. 27 is a structural diagram of another gate driver circuit electrically connected to sub-pixels, in accordance with some embodiments of the present disclosure.

As shown in FIGS. 26 and 27, P1, P2, P3, and P4 may represent the first row of sub-pixels P, the second row of sub-pixels P, the third row of sub-pixels P, and the fourth row of sub-pixels P, respectively.

In some examples, as shown in FIGS. 26 and 27, one stage of shift register 100 in the gate driver circuit 1000 may be electrically connected to one row of sub-pixels P. That is, one stage of shift register 100 in the gate driver circuit 1000 may be electrically connected to pixel driving circuits 200 in one row of sub-pixels P. The connection relationship may be that: an input signal terminal Input of one shift register 100 may be electrically connected to the first scan signal terminals Gate1 of one row of pixel driving circuits 200, and a first output signal terminal Out1 of the shift register 100 may be electrically connected to the second scan signal terminals Gate2 of the row of pixel driving circuits 200.

For example, one shift register 100 may be electrically connected to one row of pixel driving circuits 200 through two gate lines GL. The input signal terminal Input of the shift register 100 may be electrically connected to the first scan signal terminals Gate1 of a corresponding row of pixel driving circuits 200 through one gate line GL. The input signal terminal Input not only transmits an input signal to the shift register 100, but also transmits the input signal to the first scan signal terminals Gate1 of the corresponding row of pixel driving circuits 200 as a first scan signal, so as to drive the corresponding row of pixel driving circuits 200. The first output signal terminal Out1 of the shift register 100 may be electrically connected to the second scan signal terminals Gate2 of the corresponding row of pixel driving circuits 200 through another gate line GL. The first output signal output by the first output signal terminal Out1 serves as a second scan signal of the corresponding row of pixel driving circuits 200 to drive the corresponding row of pixel driving circuits 200.

The foregoing descriptions are merely specific implementation manners of the present disclosure, but the protection scope of the present disclosure is not limited thereto. Any person skilled in the art could conceive of changes or replacements within the technical scope of the present disclosure, which shall be included in the protection scope of the present disclosure. Therefore, the protection scope of the present disclosure shall be subject to the protection scope of the claims.

What is claimed is:

1. A shift register, comprising:
a first input sub-circuit electrically connected to an input signal terminal, a first voltage signal terminal, a first clock signal terminal and a first node, wherein the first input sub-circuit is configured to transmit a first clock signal received at the first clock signal terminal to the first node in response to an input signal received at the input signal terminal and a first voltage signal received at the first voltage signal terminal;
a first output sub-circuit electrically connected to the first node, a second voltage signal terminal and a first output signal terminal, wherein the first output sub-circuit is configured to transmit a second voltage signal received at the second voltage signal terminal to the first output signal terminal under control of a voltage of the first node, so that the first output signal terminal outputs the second voltage signal;
a second input sub-circuit electrically connected to the input signal terminal, the first clock signal terminal and a second node, wherein the second input sub-circuit is configured to transmit the input signal received at the input signal terminal to the second node in response to the first clock signal; and
a second output sub-circuit electrically connected to the second node, the first voltage signal terminal, and the first output signal terminal, wherein the second output sub-circuit is configured to transmit the first voltage signal received at the first voltage signal terminal to the first output signal terminal under control of a voltage of the second node, so that the first output signal terminal outputs the first voltage signal, a voltage value of one of the first voltage signal and the second voltage signal being greater than that of a reference voltage, and a voltage value of another one of the first voltage signal and the second voltage signal being less than that of the reference voltage.

2. The shift register according to claim 1, wherein the first input sub-circuit includes a first transistor, a second transistor, and a first capacitor;
a gate of the first transistor is electrically connected to the input signal terminal, a first electrode of the first transistor is electrically connected to the first voltage signal terminal, and a second electrode of the first transistor is electrically connected to a third node;
a gate of the second transistor is electrically connected to the third node, a first electrode of the second transistor is electrically connected to the first clock signal terminal, and a second electrode of the second transistor is electrically connected to the first node;
a first terminal of the first capacitor is electrically connected to the first clock signal terminal, and a second terminal of the first capacitor is electrically connected to the third node.

3. The shift register according to claim 1 or 2, wherein the first output sub-circuit includes a fourth transistor and a second capacitor;
a gate of the fourth transistor is electrically connected to the first node, a first electrode of the fourth transistor is electrically connected to the second voltage signal terminal, and a second electrode of the fourth transistor is electrically connected to the first output signal terminal;
a first terminal of the second capacitor is electrically connected to the first node, and a second terminal of the second capacitor is electrically connected to the second voltage signal terminal.

4. The shift register according to claim 1, further comprising a control sub-circuit, wherein
the control sub-circuit is electrically connected to the first voltage signal terminal, the second node, and the first node, and the control sub-circuit is configured to transmit the first voltage signal received at the first voltage signal terminal to the first node under the control of the voltage of the second node, so as to control the first output sub-circuit to be turned off in a period when the second output sub-circuit outputs the first voltage signal.

5. The shift register according to claim 4, wherein the control sub-circuit includes a sixth transistor;
a gate of the sixth transistor is electrically connected to the second node, a first electrode of the sixth transistor is electrically connected to the first voltage signal terminal, and a second electrode of the sixth transistor is electrically connected to the first node.

6. The shift register according to claim 1, further comprising a level reduction sub-circuit, wherein
the level reduction sub-circuit is electrically connected to the second voltage signal terminal and the first output signal terminal, and the level reduction sub-circuit is configured to reduce a level of the second voltage signal output by the first output signal terminal in cooperation with the first output sub-circuit in a period when the first output sub-circuit outputs the second voltage signal.

7. The shift register according to claim 6, wherein the level reduction sub-circuit includes a seventh transistor; and
a gate of the seventh transistor is electrically connected to the first output signal terminal, a first electrode of the seventh transistor is electrically connected to the second voltage signal terminal, and a second electrode of the seventh transistor is electrically connected to the first output signal terminal.

8. The shift register according to claim 1, further comprising a potential stabilization sub-circuit, wherein
the potential stabilization sub-circuit is electrically connected to the second voltage signal terminal, the second node and a fourth node; and the potential stabilization sub-circuit is configured to transmit the voltage of the second node to the fourth node in response to the second voltage signal and stabilize a voltage of the fourth node, wherein
the second output sub-circuit is electrically connected to the fourth node, and is electrically connected to the second node through the potential stabilization sub-circuit.

9. The shift register according to claim 8, wherein the potential stabilization sub-circuit includes an eighth transistor;
a gate of the eighth transistor is electrically connected to the second voltage signal terminal, a first electrode of the eighth transistor is electrically connected to the second node, and a second electrode of the eighth transistor is electrically connected to the fourth node;
the second output sub-circuit includes a fifth transistor and a third capacitor,
a gate of the fifth transistor is electrically connected to the fourth node, and is electrically connected to the second node through the eighth transistor, a first electrode of the fifth transistor is electrically connected to the first voltage signal terminal, and a second electrode of the fifth transistor is electrically connected to the first output signal terminal; and
a first terminal of the third capacitor is electrically connected to the fourth node, and is electrically connected to the second node through the eighth transistor, and a second terminal of the third capacitor is electrically connected to the first output signal terminal.

10. The shift register according to claim 1, further comprising:
a first inversion sub-circuit electrically connected to the first output signal terminal, the first voltage signal terminal, and a second output signal terminal, wherein the first inversion sub-circuit is configured to transmit the first voltage signal received at the first voltage signal terminal to the second output signal terminal in response to a signal received at the first output signal terminal; and
a second inversion sub-circuit electrically connected to the first output signal terminal, the second voltage signal terminal, a second clock signal terminal, and the second output signal terminal, wherein the second inversion sub-circuit is configured to transmit the second voltage signal received at the second voltage signal terminal to the second output signal terminal in response to the signal received at the first output signal terminal and a second clock signal received at the second clock signal terminal.

11. The shift register according to claim 10, wherein the first inversion sub-circuit includes a ninth transistor;
a gate of the ninth transistor is electrically connected to the first output signal terminal, a first electrode of the ninth transistor is electrically connected to the first voltage signal terminal, and a second electrode of the ninth transistor is electrically connected to the second output signal terminal;
the second inversion sub-circuit is further electrically connected to the first voltage signal terminal, and includes a tenth transistor, an eleventh transistor, a twelfth transistor, and a fourth capacitor;
a gate of the tenth transistor is electrically connected to the first output signal terminal, a first electrode of the tenth transistor is electrically connected to the first voltage signal terminal, and a second electrode of the tenth transistor is electrically connected to a fifth node;

a gate of the eleventh transistor is electrically connected to the second clock signal terminal, a first electrode of the eleventh transistor is electrically connected to the second voltage signal terminal, and a second electrode of the eleventh transistor is electrically connected to the fifth node;

a gate of the twelfth transistor is electrically connected to the fifth node, a first electrode of the twelfth transistor is electrically connected to the second voltage signal terminal, and a second electrode of the twelfth transistor is electrically connected to the second output signal terminal; and a first terminal of the fourth capacitor is electrically connected to the fifth node, and a second terminal of the fourth capacitor is electrically connected to the second output signal terminal.

12. A driving method of the shift register according to claim 1, comprising:

in a first output period, transmitting, by the first output sub-circuit, the second voltage signal received at the second voltage signal terminal to the first output signal terminal when the first output sub-circuit is turned on under the control of the voltage of the first node, so that the first output signal terminal outputs the second voltage signal; and turning off the second output sub-circuit under the control of the voltage of the second node; and in a second output period, turning off the first output sub-circuit under the control of the voltage of the first node; and transmitting, by the second output sub-circuit, the first voltage signal received at the first voltage signal terminal to the first output signal terminal when the second output sub-circuit is turned on under the control of the voltage of the second node, so that the first output signal terminal outputs the first voltage signal.

13. A gate driver circuit, comprising a plurality of cascaded shift registers each according to claim 1.

14. A display apparatus, comprising the gate driver circuit according to claim 13.

15. The display apparatus according to claim 14, further comprising a plurality of pixel driving circuits;

the plurality of pixel driving circuits are arranged in rows in a first direction, and a row of pixel driving circuits includes at least two pixel driving circuits; and in the gate driver circuit, an input signal terminal of one shift register is electrically connected to first scan signal terminals of one row of pixel driving circuits, and a first output signal terminal of the shift register is electrically connected to second scan signal terminals of the row of pixel driving circuits.

16. The gate driver circuit according to claim 13, further comprising a first sub-clock signal line, a second sub-clock signal line, and a third sub-clock signal line, wherein an input signal terminal of a first stage of shift register is electrically connected to the first sub-clock signal line; except for the first stage of shift register, for other stages of shift registers, an input signal terminal of any stage of shift register is electrically connected to a first output signal terminal of a previous stage of shift register; and first clock signal terminals of odd stages of shift registers are electrically connected to the second sub-clock signal line, and first clock signal terminals of even stages of shift registers are electrically connected to the third sub-clock signal line.

17. The gate driver circuit according to claim 13, wherein the shift register further includes:

a first inversion sub-circuit electrically connected to the first output signal terminal, the first voltage signal terminal, and a second output signal terminal, wherein the first inversion sub-circuit is configured to transmit the first voltage signal received at the first voltage signal terminal to the second output signal terminal in response to a signal received at the first output signal terminal; and a second inversion sub-circuit electrically connected to the first output signal terminal, the second voltage signal terminal, a second clock signal terminal, and the second output signal terminal, wherein the second inversion sub-circuit is configured to transmit the second voltage signal received at the second voltage signal terminal to the second output signal terminal in response to the signal received at the first output signal terminal and a second clock signal received at the second clock signal terminal;

the gate driver circuit further comprises a first sub-clock signal line, a second sub-clock signal line, a third sub-clock signal line, a fourth sub-clock signal line and a fifth sub-clock signal line, wherein an input signal terminal of a first stage of shift register is electrically connected to the first sub-clock signal line; except for the first stage of shift register, for other stages of shift registers, an input signal terminal of any stage of shift register is electrically connected to a second output signal terminal of a previous stage of shift register;

first clock signal terminals of odd stages of shift registers are electrically connected to the second sub-clock signal line, and second clock signal terminals of the odd stages of shift registers are electrically connected to the fourth sub-clock signal line, and first clock signal terminals of even stages of shift registers are electrically connected to the third sub-clock signal line, and second clock signal terminals of the even stages of shift registers are electrically connected to the fifth sub-clock signal line.

18. The shift register according to claim 1, wherein the second input sub-circuit includes a third transistor; and a gate of the third transistor is electrically connected to the first clock signal terminal, a first electrode of the third transistor is electrically connected to the input signal terminal, and a second electrode of the third transistor is electrically connected to the second node.

19. The shift register according to claim 1, wherein the second output sub-circuit includes a fifth transistor and a third capacitor;

a gate of the fifth transistor is electrically connected to the second node, a first electrode of the fifth transistor is electrically connected to the first voltage signal terminal, and a second electrode of the fifth transistor is electrically connected to the first output signal terminal; and a first terminal of the third capacitor is electrically connected to the second node, and a second terminal of the third capacitor is electrically connected to the first voltage signal terminal.

* * * * *

UNITED STATES PATENT AND TRADEMARK OFFICE
CERTIFICATE OF CORRECTION

PATENT NO. : 11,741,902 B2
APPLICATION NO. : 17/614311
DATED : August 29, 2023
INVENTOR(S) : Yao Huang et al.

Page 1 of 1

It is certified that error appears in the above-identified patent and that said Letters Patent is hereby corrected as shown below:

In the Claims

In Column 31, Line 12, please change "claim 1 or 2" to -- claim 1 --.

Signed and Sealed this
Second Day of January, 2024

Katherine Kelly Vidal
*Director of the United States Patent and Trademark Office*